United States Patent
Jang et al.

(10) Patent No.: US 12,362,033 B2
(45) Date of Patent: Jul. 15, 2025

(54) SEMICONDUCTOR MODULE FOR PERFORMING ERROR CORRECTION OPERATION

(71) Applicant: SK hynix Inc., Icheon-si (KR)

(72) Inventors: Mun Seon Jang, Icheon-si (KR); Kyung Whan Kim, Icheon-si (KR); Dae Suk Kim, Icheon-si (KR); Jin Ho Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 166 days.

(21) Appl. No.: 18/459,930

(22) Filed: Sep. 1, 2023

(65) Prior Publication Data
US 2024/0386985 A1    Nov. 21, 2024

(30) Foreign Application Priority Data
May 18, 2023    (KR) .......................... 10-2023-0064665

(51) Int. Cl.
| | | |
|---|---|---|
| *G11C 29/52* | (2006.01) | |
| *G11C 11/408* | (2006.01) | |
| *G11C 11/4093* | (2006.01) | |
| *G11C 11/4096* | (2006.01) | |

(52) U.S. Cl.
CPC .......... *G11C 29/52* (2013.01); *G11C 11/4087* (2013.01); *G11C 11/4093* (2013.01); *G11C 11/4096* (2013.01)

(58) Field of Classification Search
CPC . G11C 29/52; G11C 11/4087; G11C 11/4093; G11C 11/4096
See application file for complete search history.

(56) References Cited

U.S. PATENT DOCUMENTS

| | | | | |
|---|---|---|---|---|
| 2022/0179564 A1* | 6/2022 | Lee | ........................ | G06F 3/0619 |
| 2023/0035079 A1* | 2/2023 | Han | ........................ | G06F 3/0619 |

FOREIGN PATENT DOCUMENTS

KR    1020200038145 A    4/2020

* cited by examiner

*Primary Examiner* — Han Yang
(74) *Attorney, Agent, or Firm* — WILLIAM PARK & ASSOCIATES LTD.

(57) ABSTRACT

A semiconductor module includes an address control circuit configured to generate an internal address based on an address in a first read operation and a second read operation that are sequentially performed and configured to generate multiple decoding enable signals and an error information enable signal, a memory circuit including multiple mats and configured to output internal data based on the internal address and the multiple decoding enable signals in the first read operation and configured to output internal meta data and second internal parities based on the internal address and the multiple decoding enable signals in the second read operation, and an error information storage circuit configured to output first internal parities based on the internal address and the error information enable signal in the first read operation.

20 Claims, 13 Drawing Sheets

SEMICONDUCTOR MODULE FOR PERFORMING ERROR CORRECTION OPERATION

CROSS-REFERENCE TO RELATED APPLICATION

The present application claims priority under 35 U.S.C. § 119(a) to Korean Patent Application No. 10-2023-0064665, filed in the Korean Intellectual Property Office on May 18, 2023, the entire disclosure of which is incorporated herein by reference.

BACKGROUND

1. Technical Field

An embodiment of the present disclosure generally relates to a semiconductor module, and more particularly, to a semiconductor module related to performing an error correction operation on data by using some bits stored in a memory circuit in which meta data has been stored as a parity that is used in an error correction code (ECC) circuit, after outputting internal data after the start of a read operation.

2. Related Art

Recently, in order to increase the operating speed of a semiconductor device, methods, such as DDR2, DDR3, DDR4, and DDR5 for inputting/outputting multi-bit data for each clock cycle, are being used. When the input/output speed of data becomes fast, a separate device and method for guaranteeing the reliability of data transmission is additionally required because the probability that an error occurs in a process of transmitting data is also increased.

A method of guaranteeing the reliability of data transmission by generating an error check code capable of checking whether an error occurs whenever data is transmitted and transmitting the error check code along with the data is being used. The error check code includes an error detection code (EDC) capable of detecting an error that has occurred and an error correction code (ECC) capable of autonomously correcting an error when the error occurs.

SUMMARY

In an embodiment, a semiconductor module may include an address control circuit configured to generate an internal address based on an address in a first read operation and a second read operation that are sequentially performed and configured to generate multiple decoding enable signals and an error information enable signal, a memory circuit including multiple mats and configured to output internal data based on the internal address and the multiple decoding enable signals in the first read operation and configured to output internal meta data and second internal parities based on the internal address and the multiple decoding enable signals in the second read operation, and an error information storage circuit configured to output first internal parities based on the internal address and the error information enable signal in the first read operation.

In an embodiment, a semiconductor module may include a first memory circuit configured to output first internal data that has been stored in the first memory circuit after the start of a first read operation, a second memory circuit configured to output second internal data that has been stored in the second memory circuit after the start of the first read operation, an error information storage circuit configured to output first internal parities that has been stored in the error information storage circuit after the start of the first read operation, and an error correction code (ECC) circuit configured to receive the first internal data, the second internal data, and the first internal parities after the start of the first read operation, configured to receive internal meta data and second internal parities that are output by any one of the first memory circuit or the second memory circuit after the start of a second read operation and configured to correct and output an error that is included in the first internal data, the second internal data, and the internal meta data, based on the first internal parities and the second internal parities.

In an embodiment, a semiconductor module may include a memory circuit including multiple mats, configured to output internal data based on an internal address and multiple decoding enable signals in a first read operation of a read modify write operation, configured to output internal meta data and second internal parities based on the internal address and the multiple decoding enable signals in a second read operation of the read modify write operation, and configured to store the internal data having an error corrected, the internal meta data having an error corrected, and the second internal parities after the start of a write operation of the read modify write operation, an error information storage circuit configured to output first internal parities based on the internal address and an error information enable signal in the first read operation of the read modify write operation, and an error correction code (ECC) circuit configured to receive the internal data and the first internal parities after the start of the first read operation of the read modify write operation, configured to receive the internal meta data and the second internal parities after the start of the second read operation of the read modify write operation, configured to generate the internal data from transfer data after the start of the read modify write operation, and configured to output the internal data and the internal meta data to the memory circuit by correcting an error that is included in the internal data and the internal meta data based on the first internal parities and the second internal parities.

DETAILED DESCRIPTION

Figure 1:
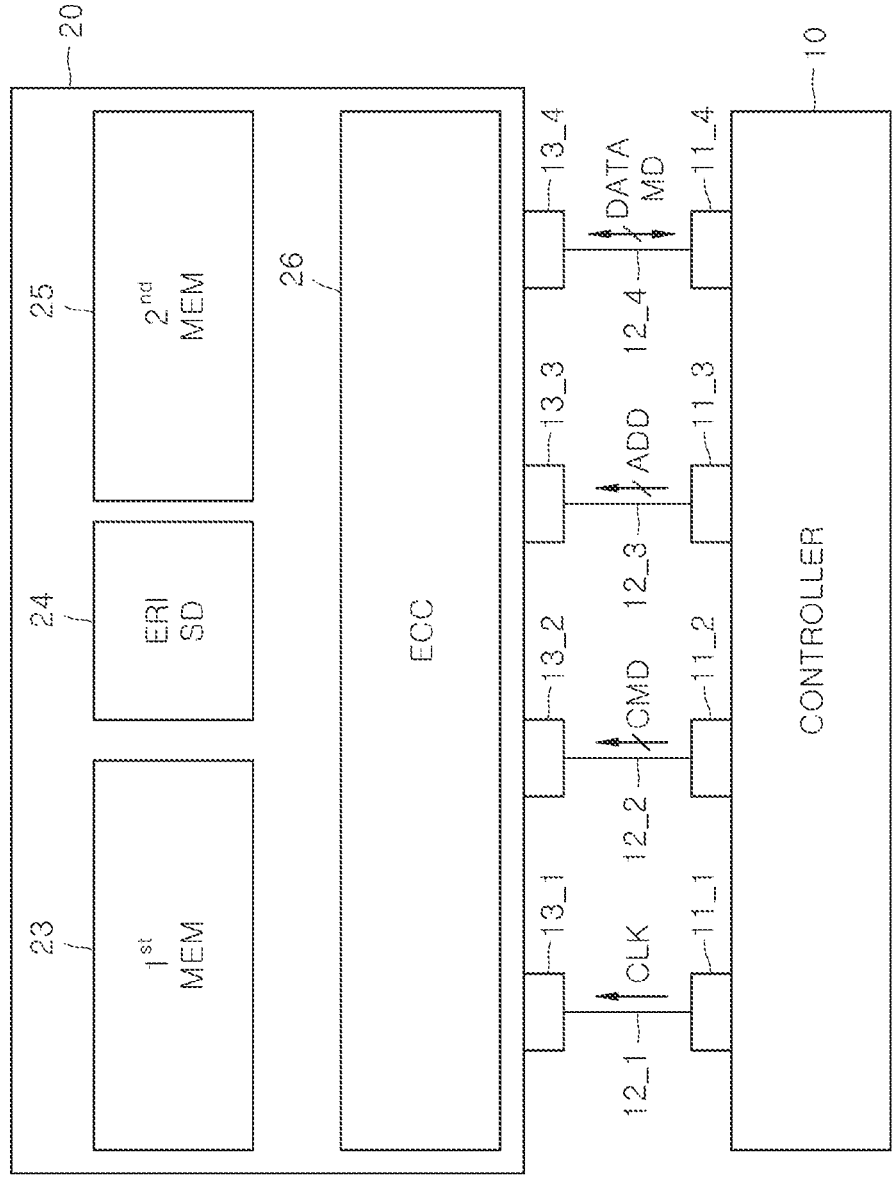
FIG. 1 is a block diagram illustrating a construction of a semiconductor system according to an embodiment of the present disclosure.

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. In contrast, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

Hereafter, the present disclosure will be described in more detail through embodiments. The embodiments are only used to exemplify the present disclosure, and the scope of the present disclosure is not limited by the embodiments.

Embodiments of the present disclosure provide a semiconductor module for performing an error correction operation on data by using some bits stored in a memory circuit in which meta data has been stored as a parity that is used in an ECC circuit, after outputting internal data after the start of a read operation.

According to an embodiment of the present disclosure, it is possible to correct an error of data by using some bits stored in a memory circuit in which meta data has been stored as a parity that is used in an ECC circuit, after outputting internal data after the start of a read operation.

Furthermore, according to an embodiment of the present disclosure, it is possible to increase the error correction ability of the ECC circuit by using some bits stored in a memory circuit in which meta data has been stored as a parity that is used in an ECC circuit, after outputting internal data after the start of a read operation.

As illustrated in FIG. 1, a semiconductor system 1 according to an embodiment of the present disclosure may include a controller 10 and a semiconductor module 20.

The controller 10 may include a first control pin 11_1, a second control pin 112, a third control pin 11_3, and a fourth control pin 11_4. The semiconductor module 20 may include a first device pin 13_1, a second device pin 132, a third device pin 133, and a fourth device pin 13_4. A first transmission line 12_1 may be connected between the first control pin 11_1 and the first device pin 131. A second transmission line 12_2 may be connected between the second control pin 11_2 and the second device pin 13_2. A third transmission line 12_3 may be connected between the third control pin 11_3 and the third device pin 13_3. A fourth transmission line 12_4 may be connected between the fourth control pin 11_4 and the fourth device pin 13_4. The controller 10 may transmit a clock CLK for controlling the semiconductor module 20 to the semiconductor module 20 through the first transmission line 12_1. The controller 10 may transmit a command CMD for controlling the semiconductor module 20 to the semiconductor module 20 through the second transmission line 12_2. The controller 10 may transmit an address ADD for controlling the semiconductor module 20 to the semiconductor module 20 through the third transmission line 12_3. The controller 10 may transmit data DATA and meta data MD to the semiconductor module 20 through the fourth transmission line 12_4. The controller 10 may receive data DATA and meta data MD from the semiconductor module 20 through the fourth transmission line 12_4. The controller 10 may output the clock CLK, the command CMD, and the address ADD for performing first and second read operations to the semiconductor module 20. The controller may receive the data DATA and the meta data MD from the semiconductor module 20 after the start of a read operation. The controller 10 may output the clock CLK, the command CMD, the address ADD, the data DATA, and the meta data MD for performing a read modify write operation to the semiconductor module 20.

The clock CLK may be set as a signal that is additionally toggled in order to synchronize operations of the controller 10 and the semiconductor module 20. The command CMD may include multiple bits, and may be output to have a logic level combination for performing the first and second read operations and read modify write operation of the semiconductor module 20. The address ADD may include multiple bits, and may be output to have a logic level combination for outputting first and second internal data (ID1<1:64> and ID2<1:64> in FIG. 2) and first internal parities (IP1<1:8> in FIG. 2) after the start of the first read operation of the semiconductor module 20. The address ADD may include multiple bits, and may be output to have a logic level combination for outputting internal meta data (IMD<1:2> in FIG. 2) and second internal parities (IP2<1:6> in FIG. 2) after the start of the second read operation of the semiconductor module 20. The address ADD may include multiple bits, and may be output to have a logic level combination for storing the first and second internal data (ID1<1:64> and ID2<1:64> in FIG. 2) after the start of the read modify write operation of the semiconductor module 20. The data DATA may include multiple bits, and may be set as common data that are input and output after the start of a read operation and a read modify write operation. The meta data MD may include multiple bits, and may include additional information in inputting and outputting the data DATA. For example, the meta data MD may be set as a signal including various types of information, such as temperature information, operating state information, and latency time information of the semiconductor module 20.

The semiconductor module 20 may include a first memory circuit (1st MEM) 23, an error information storage circuit (ERI SD) 24, a second memory circuit (2nd MEM) 24, and an ECC circuit (ECC) 26.

The first memory circuit 23 may output the first internal data (ID1<1:64> in FIG. 2) stored at a location that is selected by the address ADD, after the start of the first read operation. The first memory circuit 23 may output the internal meta data (IMD<1:2> in FIG. 2) and the second internal parities (IP2<1:6> in FIG. 2) stored at a location that is selected by the address ADD, after the start of the second read operation. The first memory circuit 23 may store the first internal data (ID1<1:64> in FIG. 2) in a location that is selected by the address ADD, after the start of the read modify write operation.

The error information storage circuit 24 may output the first internal parities (IP1<1:8> in FIG. 2) stored at a location that is selected by the address ADD, after the start of the first read operation.

The second memory circuit 25 may output the second internal data (ID2<1:64> in FIG. 2) stored at a location that is selected by the address ADD, after the start of the first read operation. The second memory circuit 25 may output the internal meta data (IMD<1:2> in FIG. 2) and the second internal parities (IP2<1:6> in FIG. 2) stored at a location that is selected by the address ADD, after the start of the second read operation. The second memory circuit 25 may store the second internal data (ID2<1:64> in FIG. 2) in a location that is selected by the address ADD, after the start of the read modify write operation.

The ECC circuit 26 may receive the first internal data (ID1<1:64> in FIG. 2), the second internal data (ID2<1:64> in FIG. 2), and the first internal parities (IP1<1:8> in FIG. 2) after the start of the first read operation. The ECC circuit 26 may receive the second internal parities (IP2<1:6> in FIG. 2) after the start of the second read operation, and may correct an error that is included in the first internal data (ID1<1:64> in FIG. 2) and the second internal data (ID2<1:64> in FIG. 2), based on the first internal parities (IP1<1:8> in FIG. 2) and the second internal parities (IP2<1:6> in FIG. 2). The ECC circuit 26 may generate the first internal data (ID1<1:64> in FIG. 2) and the second internal data (ID2<1:64> in FIG. 2) by correcting an error that is included in the data DATA based on the first internal parities (IP1<1:8> in FIG. 2) and the second internal parities (IP2<1:6> in FIG. 2), after the start of the read modify write operation.

Figure 2:
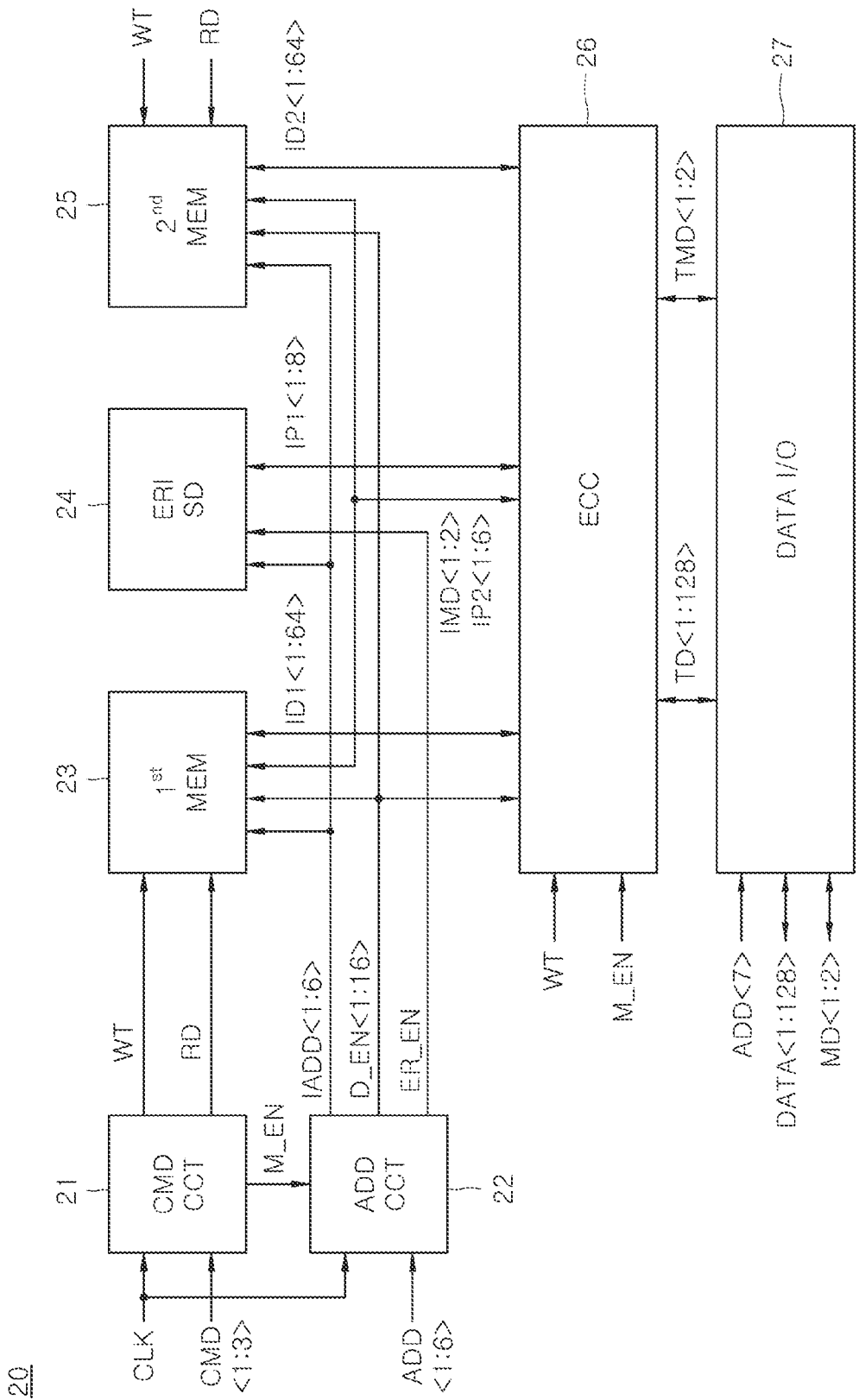
FIG. 2 is a block diagram illustrating a construction according to an embodiment of a semiconductor module that is included in the semiconductor system illustrated in FIG. 1.

As illustrated in FIG. 2, the semiconductor module 20 may include a command control circuit (CMD CCT) 21, an address control circuit (ADD CCT) 22, the first memory circuit (1st MEM) 23, the error information storage circuit (ERI SD) 24, the second memory circuit (2nd MEM) 25, the ECC circuit (ECC) 26, and a data input and output circuit (DATA I/O) 27.

The command control circuit 21 may generate a write signal WT, a read signal RD, and a meta enable signal M_EN, based on commands CMD<1:3>, in synchronization with the clock CLK. The command control circuit 21 may generate the read signal RD that is enabled when the commands CMD<1:3> that are input in synchronization with the clock CLK have a logic level combination for performing the first and second read operations. The command control circuit 21 may generate the read signal RD and the write signal WT that are sequentially enabled when the commands CMD<1:3> that are input in synchronization with the clock CLK have a logic level combination for performing the read modify write operation. The command control circuit 21 may generate the meta enable signal M_EN that is disabled when the commands CMD<1:3> that are input in synchronization with the clock CLK have a logic level combination for performing the first read operation. The command control circuit 21 may generate the meta enable signal M_EN that is enabled when the commands CMD<1:3> that are input in synchronization with the clock CLK have a logic level combination for performing the second read operation. The first read operation and the second read operation may be sequentially performed. The commands CMD<1:3> have been set to include three bits, but may be set to include various numbers of bits according to an embodiment. The read modify write operation may be set as an operation of a write operation being performed after the first and second read operations are performed.

The address control circuit 22 may generate internal addresses IADD<1:6> based on addresses ADD<1:6> in synchronization with the clock CLK. The address control circuit 22 may generate the internal addresses IADD<1:6> based on the addresses ADD<1:6> in synchronization with the clock CLK after the start of the first read operation. The address control circuit 22 may generate decoding enable signals D_EN<1:16> all of which are enabled after the start of the first read operation. The address control circuit 22 may generate an error information enable signal ER_EN that is enabled after the start of the first read operation. The address control circuit 22 may enable any one of the decoding enable signals D_EN<1:16> based on the addresses ADD<1:6> after the start of the second read operation. The address control circuit 22 may generate the internal addresses IADD<1:6> based on the addresses ADD<1:6> in synchronization with the clock CLK after the start of the read modify write operation. The internal addresses IADD<1:6> may be set as addresses for selecting a column path of the first memory circuit 23, the error information storage circuit 24, and the second memory circuit 25. The internal addresses IADD<1:6> have been set to include six bits, but may be set to include various numbers of bits according to an embodiment. The decoding enable signals D_EN<1:16> have been set to include sixteen bits, but may be set to include various numbers of bits according to an embodiment.

The first memory circuit 23 may output the first internal data ID1<1:64>, based on the first to sixth internal addresses IADD<1:6> and the first to eighth bits D_EN<1:8> of the decoding enable signals all of which are enabled, when the read signal RD is enabled, after the start of the first read operation. The first memory circuit 23 may output the internal meta data IMD<1:2> and the second internal parities IP2<1:6>, based on the internal addresses IADD<1:6> and any one of the first to eighth bits D_EN<1:8> of the decoding enable signals, when the read signal RD is enabled, after the start of the second read operation. The first memory circuit 23 may store the first internal data ID1<1:64> based on the internal addresses IADD<1:6> and any one of the first to eighth bits D_EN<1:8> of the decoding enable signals when the write signal WT is enabled.

The error information storage circuit 24 may output the first internal parities IP1<1:8> that have been stored in the error information storage circuit 24, when the error information enable signal ER_EN is enabled after the start of the first read operation.

The second memory circuit 25 may output the second internal data ID2<1:64>, based on the internal addresses IADD<1:6> and the ninth to sixteenth bits D_EN<9:16> of the decoding enable signals all of which are enabled, when the read signal RD is enabled, after the start of the first read operation. The second memory circuit 25 may output the internal meta data IMD<1:2> and the second internal parities IP2<1:6>, based on the internal addresses IADD<1:6> and any one of the ninth to sixteenth bits D_EN<9:16> of the decoding enable signals, when the read signal RD is enabled, after the start of the second read operation. The second memory circuit 25 may store the second internal data ID2<1:64>, based on the internal addresses IADD<1:6> and any one of the ninth to sixteenth bits D_EN<9:16> of the decoding enable signals, when the write signal WT is enabled.

The ECC circuit 26 may receive the first internal data ID1<1:64>, the second internal data ID2<1:64>, and the first internal parities IP1<1:8> after the start of the first read operation. The ECC circuit 26 may receive the first internal data ID1<1:64> and the second internal data ID2<1:64> based on the write signal WT and the meta enable signal M_EN after the start of the first read operation. The ECC circuit 26 may receive the internal meta data IMD<1:2> and the second internal parities IP2<1:6> after the start of the second read operation. The ECC circuit 26 may receive the internal meta data IMD<1:2> and the second internal parities IP2<1:6> based on the write signal WT and the decoding enable signals D_EN<1:16> after the start of the second read operation. The ECC circuit 26 may output the first internal data ID1<1:64>, the second internal data ID2<1:64>, and the internal meta data IMD<1:2> as transfer data TD<1:128> and transfer meta data TMD<1:2> by correcting an error that is included in the first internal data ID1<1:64>, the second internal data ID2<1:64>, and the internal meta data IMD<1:2>, based on the first internal parities IP1<1:8> and the second internal parities IP2<1:6> after the start of the second read operation. The ECC circuit 26 may generate any one of the first internal data ID1<1:64> and the second internal data ID2<1:64> by correcting an error that is included in the transfer data TD<1:64>, based on the first internal parities IP1<1:8> and the second internal parities IP2<1:6> after the start of the read modify write operation. The ECC circuit 26 may receive the transfer data TD<1:64> based on the write signal WT and the meta enable signal M_EN after the start of the read modify write operation, and may generate eight bits, among the first internal data ID1<1:64> and the second internal data ID2<1:64>, from write parities (WP<1:6> in FIG. 6) that are generated from the transfer data TD<1:64> and the transfer meta data TD<1:2>. In an embodiment, the ECC circuit 26 may be implemented as a common ECC circuit using a single error correction-double error detection or single error correction-double adjacent error correction (SEC-DED) code for correcting an error having 1 bit and detecting an error having two bits.

The data input and output circuit 27 may output the transfer data TD<1:128> as data DATA<1:128> after the start of a read operation, and may output the transfer meta data TMD<1:2> as meta data MD<1:2>. The data input and output circuit 27 may output the data DATA<1:64> as the first to 64-th bits TD<1:64> of the transfer data and the 65-th to 128-th bits TD<65:128> of the transfer data and output the meta data MD<1:2> as the transfer meta data TMD<1:2>, based on the seventh bit ADD<7> of the addresses after the start of the read modify write operation.

As described above, the semiconductor module 20 can perform an error correction operation on data by using some bits stored in a memory circuit in which meta data has been stored as a parity that is used in the ECC circuit 26, after outputting the first internal data ID1<1:64> and the second internal data ID2<1:64> after the start of a read operation. In an embodiment, the semiconductor module 20 can improve the error correction ability of the ECC circuit by using some bits stored in a memory circuit in which meta data has been stored as a parity that is used in the ECC circuit 26, after outputting the first internal data ID1<1:64> and the second internal data ID2<1:64> after the start of a read operation.

Figure 3:
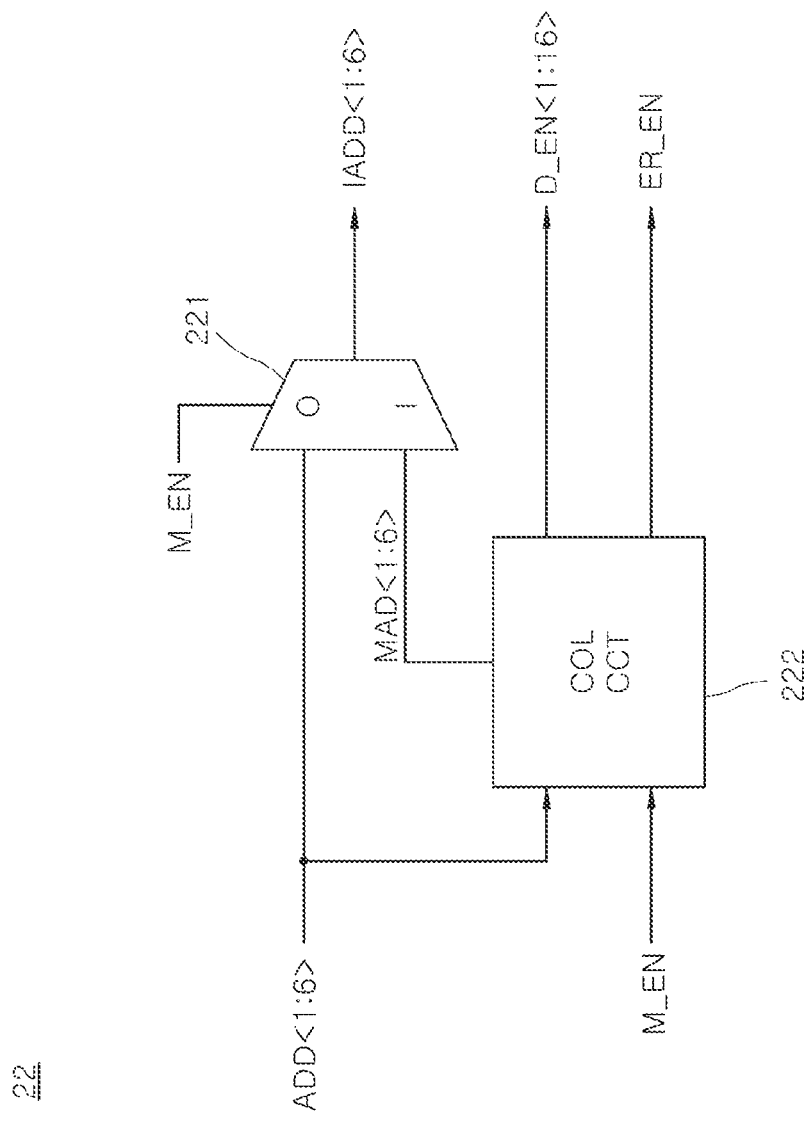
FIG. 3 is a diagram illustrating a construction according to an embodiment of an address control circuit that is included in the semiconductor module illustrated in FIG. 2.

FIG. 3 is a block diagram illustrating a construction according to an embodiment of the address control circuit 22 that is included in the semiconductor module 20. The address control circuit 22 may include an address transfer circuit 221 and a column control circuit (COL CCT) 222.

The address transfer circuit 221 may be implemented as a multiplexer. The address transfer circuit 221 may output any one of the addresses ADD<1:6> and meta addresses MAD<1:6> as the internal addresses IADD<1:6> based on the meta enable signal M_EN. The address transfer circuit 221 may output the addresses ADD<1:6> as the internal addresses IADD<1:6> when the meta enable signal M_EN is disabled to a logic low level. The address transfer circuit 221 may output the meta addresses MAD<1:6> as the internal addresses IADD<1:6> when the meta enable signal M_EN is enabled to a logic high level.

The column control circuit 222 may be implemented as a register. The column control circuit 222 may generate the meta addresses MAD<1:6> from the addresses ADD<1:6> based on the meta enable signal M_EN. The column control circuit 222 may latch the addresses ADD<1:6> having a logic level combination for outputting the internal meta data IMD<1:2> and the second internal parities IP2<1:6> when the meta enable signal M_EN is enabled to a logic high level after the start of the second read operation, and may output the latched addresses ADD<1:6> as the meta addresses MAD<1:6>. The column control circuit 222 may generate the decoding enable signals D_EN<1:16> all of which are enabled and the error information enable signal ER_EN when the meta enable signal M_EN is disabled to a logic low level after the start of the first read operation. The column control circuit 222 may enable any one of the decoding enable signals D_EN<1:16> based on the latched addresses ADD<1:6> when the meta enable signal M_EN is enabled to a logic high level after the start of the second read operation.

Figure 4:
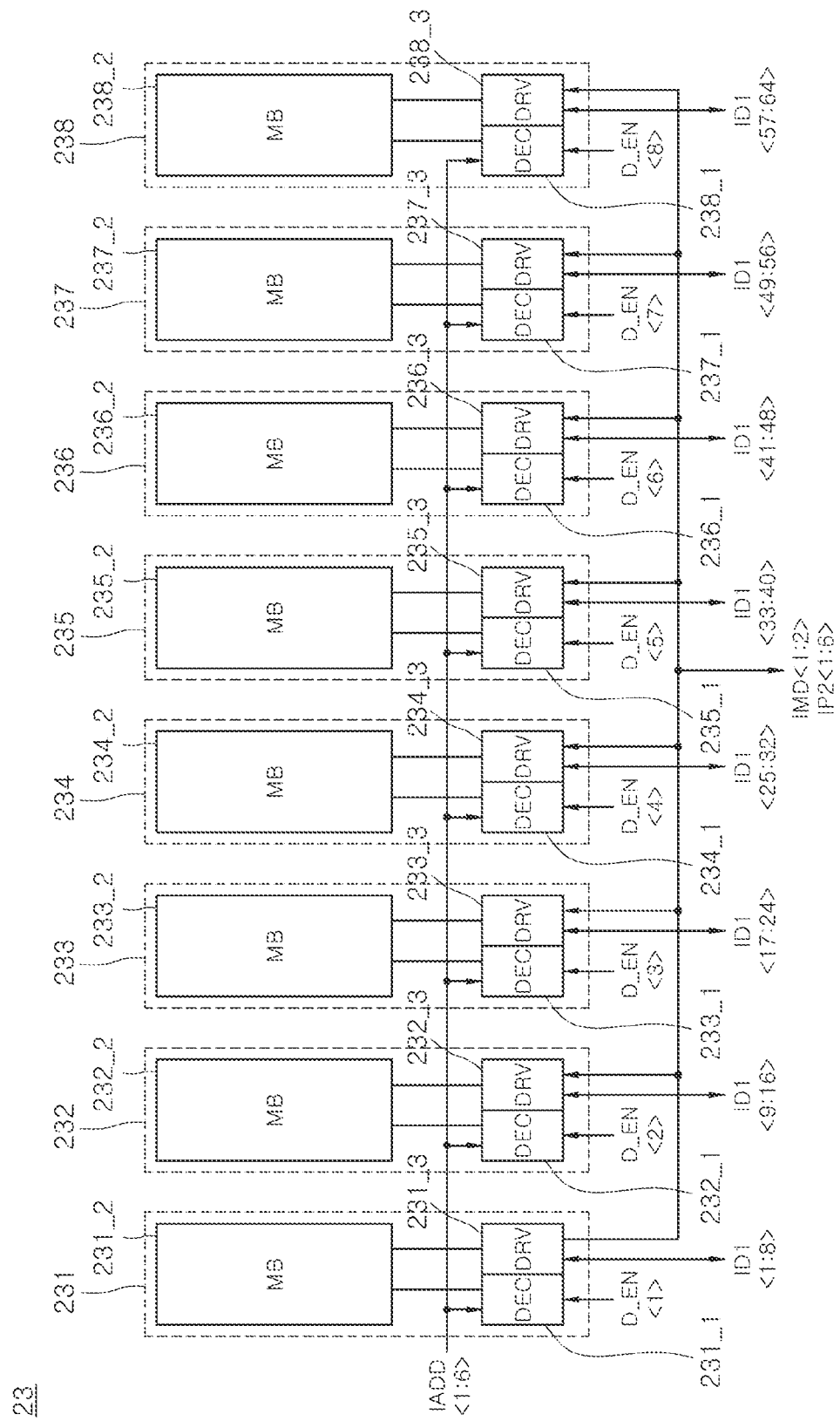
FIG. 4 is a block diagram illustrating a construction according to an embodiment of a first memory circuit that is included in the semiconductor module illustrated in FIG. 2.

FIG. 4 is a block diagram illustrating a construction according to an embodiment of the first memory circuit 23 that is included in the semiconductor module 20. The first memory circuit 23 may include a first mat 231, a second mat 232, a third mat 233, a fourth mat 234, a fifth mat 235, a sixth mat 236, a seventh mat 237, and an eighth mat 238. The first mat 231, the second mat 232, the third mat 233, the fourth mat 234, the fifth mat 235, the sixth mat 236, the seventh mat 237, and the eighth mat 238 may be set as a first group.

The first mat 231 may include a first decoder (DEC) 231_1, a first memory block (MB) 2312, and a first driver (DRV) 2313.

The first decoder 2311 may be electrically connected to the first memory block 231_2. The first decoder 231_1 may control a column operation of the first memory block 2312 by the internal addresses IADD<1:6> when the first bit D_EN<1> of the decoding enable signals is enabled to a logic high level.

The first memory block 231_2 may output the first to eighth bits ID1<1:8> of the first internal data that has been stored in a memory cell (not illustrated) that is enabled by the internal addresses IADD<1:6>, after the start of the first read operation. The first memory block 231_2 may output the internal meta data IMD<1:2> and the second internal parities IP2<1:6> that have been stored in a memory cell (not illustrated) that is enabled by the internal addresses IADD<1:6>, after the start of the second read operation. The first memory block 231_2 may store the first to eighth bits ID1<1:8> of the first internal data in a memory cell (not illustrated) that is enabled by the internal addresses IADD<1:6>, after the start of the read modify write operation. The first memory block 231_2 may store the internal meta data IMD<1:2> and the second internal parities IP2<1:6> in a memory cell (not illustrated) that is enabled by the internal addresses IADD<1:6>, after the start of the read modify write operation.

The first driver 231_3 may be electrically connected to the first memory block 231_2. The first driver 231_3 may detect, amplify, and output the first to eighth bits ID1<1:8> of the first internal data after the start of the first read operation. The first driver 231_3 may detect, amplify, and output the internal meta data IMD<1:2> and the second internal parities IP2<1:6> after the start of the second read operation. The first driver 231_3 may store the first to eighth bits ID1<1:8> of the first internal data in a memory cell (not illustrated) that is enabled by the internal addresses IADD<1:6>, by detecting and amplifying the first to eighth bits ID1<1:8> of the first internal data after the start of the read modify write operation. The first driver 231_3 may store the internal meta data IMD<1:2> and the second internal parities IP2<1:6> in a memory cell (not illustrated) that is enabled by the internal addresses IADD<1:6>, by detecting and amplifying the internal meta data IMD<1:2> and the second internal parities IP2<1:6> after the start of the read modify write operation.

The first memory circuit 23 may be implemented to include an internal circuit (not illustrated) for controlling the first memory block 231_2 and the first driver 231_3 after the start of the first and second read operations and the read modify write operation by receiving the read signal RD and the write signal WT.

Each of the second mat 232, the third mat 233, the fourth mat 234, the fifth mat 235, the sixth mat 236, the seventh mat 237, and the eighth mat 238 may be implemented to have the same construction as the first mat 231 and may perform the same operation as the first mat 231 except signals that are input to and output from each of the second to eighth mats, and thus a detailed description thereof is omitted. For example, FIG. 4, illustrates first to eight mats 231-238, first to eight memory blocks 231_2 to 238_2, first to eight decoders 231_1 to 238_1, decoding enable signal bits D_EN<1> to D_EN<8>, internal data bits <1:64>, first to eight decoders 231_1 to 238_1, and first to eight drivers 231_3 to 238_3.

Furthermore, the second memory circuit 25 may be implemented to have the same construction as the first memory circuit 23 and may perform the same operation as the first memory circuit 23 except that the second memory circuit 25 includes ninth to sixteenth mats (not illustrated) of a second group, and thus a detailed description thereof is omitted.

Figure 5:
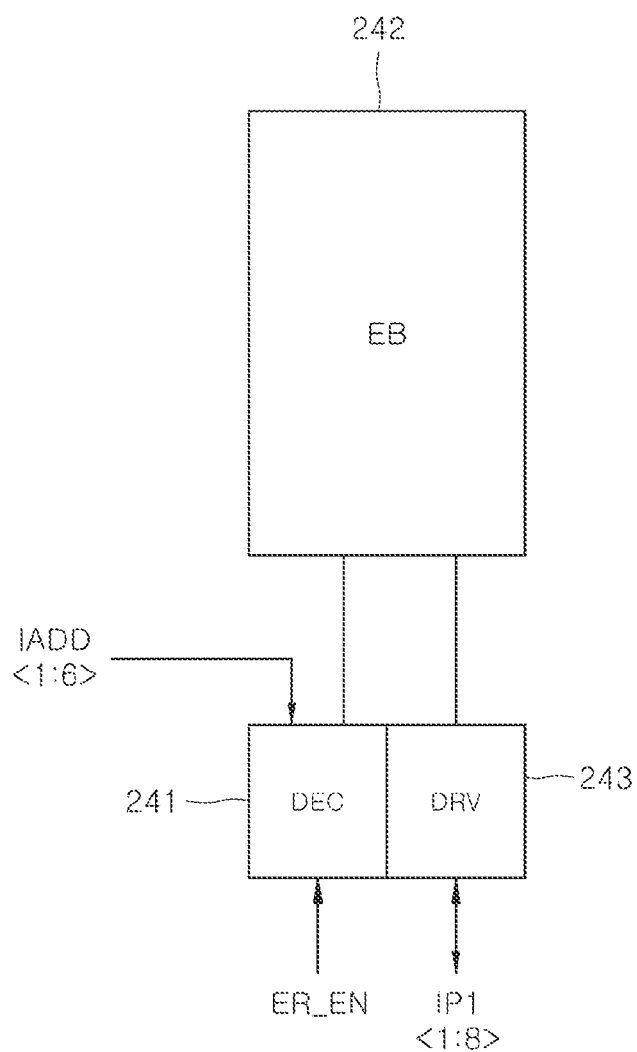
FIG. 5 is a block diagram illustrating a construction according to an embodiment of an error information storage circuit that is included in the semiconductor module illustrated in FIG. 2.

FIG. 5 is a block diagram illustrating a construction according to an embodiment of the error information storage circuit 24 that is included in the semiconductor module 20. The error information storage circuit 24 may include a parity decoder (DEC) 241, an error information block (EB) 242, and a parity driver (DRV) 243.

The parity decoder 241 may be electrically connected to the error information block 242. The parity decoder 241 may control a column operation of the error information block 242 by the internal addresses IADD<1:6> when the error information enable signal ER_EN is enabled to a logic high level.

The error information block 242 may output the first to eighth bits IP1<1:8> of the first internal parities that have been stored in a memory cell (not illustrated) that is enabled by the internal addresses IADD<1:6>, after the start of the first read operation.

The parity driver 243 may be electrically connected to the error information block 242. The parity driver 243 may detect, amplify, and output the first to eighth bits IP1<1:8> of the first internal parities after the start of the first read operation.

The error information storage circuit 24 may be implemented to include an internal circuit (not illustrated) for controlling the error information block 242 and the parity driver 243 after the start of the first read operation, by receiving the read signal RD and the write signal WT.

Figure 6:
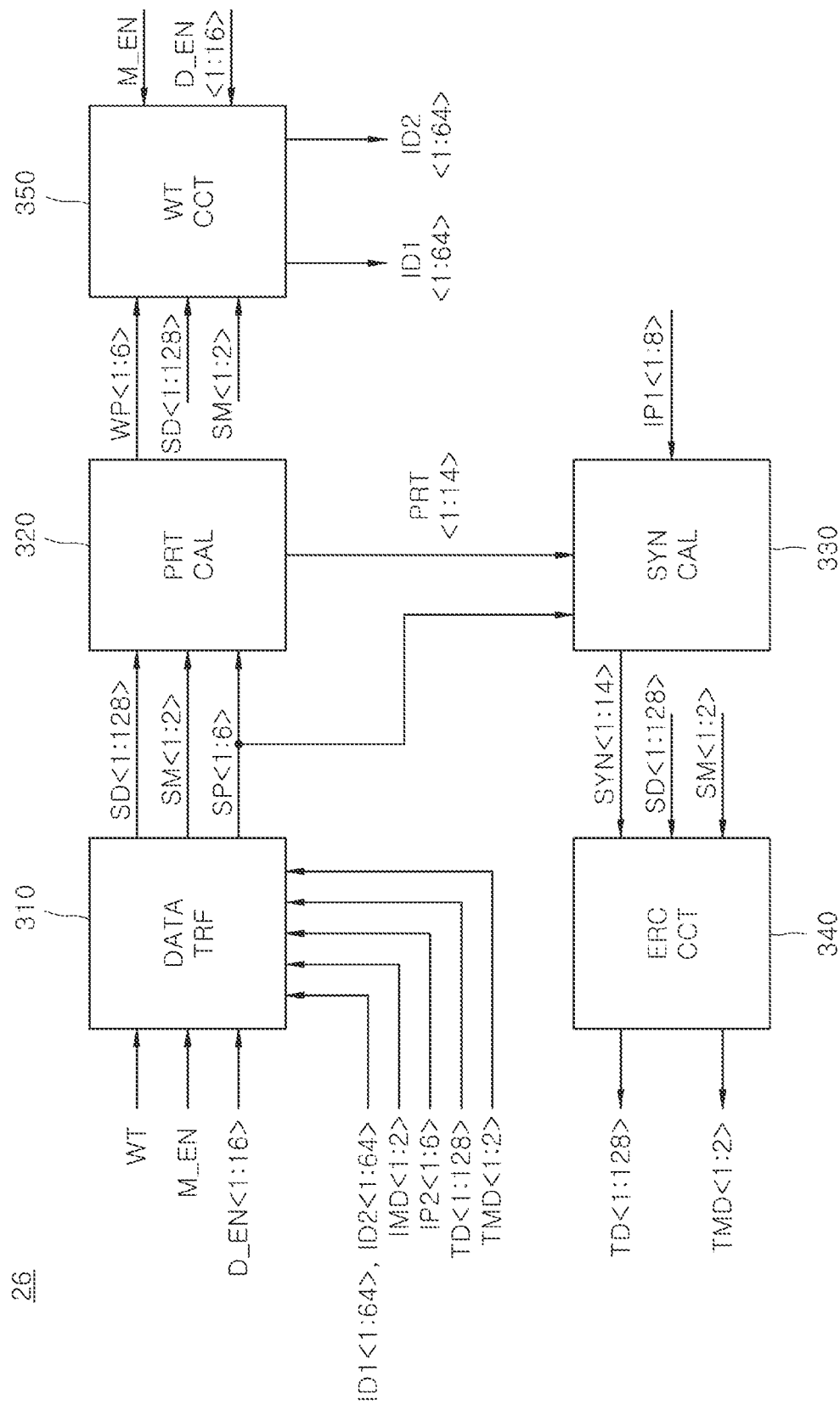
FIG. 6 is a block diagram illustrating a construction according to an embodiment of an ECC circuit that is included in the semiconductor module illustrated in FIG. 2.

FIG. 6 is a block diagram illustrating a construction according to an embodiment of the ECC circuit 26 that is included in the semiconductor module 20. The ECC circuit 26 may include a data transfer circuit (DATA TRF) 310, a parity operation circuit (PRT CAL) 320, a syndrome operation circuit (WT CCT) 330, an error correction circuit (ERC CCT) 340, and a write control circuit 350 (SYN CAL).

The data transfer circuit 310 may generate selection data SD<1:128> from the first internal data ID1<1:64> and the second internal data ID2<1:64> based on the meta enable signal M_EN after the start of the first read operation. The data transfer circuit 310 may generate selection meta data SM<1:2> and selection parities SP<1:6> from the internal meta data IMD<1:2> and the second internal parities IP2<1:6> based on the decoding enable signals D_EN<1:16> after the start of the second read operation. The data transfer circuit 310 may generate the selection data SD<1:128> from the transfer data TD<1:128> based on the write signal WT and the meta enable signal M_EN after the start of the read modify write operation. The data transfer circuit 310 may generate the selection meta data SM<1:2> from the transfer meta data TMD<1:12> based on the write signal WT and the meta enable signal M_EN after the start of the read modify write operation.

The parity operation circuit 320 may generate the write parities WP<1:6> based on the selection meta data SM<1:2> and the selection parities SP<1:6>. The parity operation circuit 320 may generate the write parities WP<1:6> by performing an ECC encoding operation on the selection meta data SM<1:2> and the selection parities SP<1:6>. The parity operation circuit 320 may generate parities PRT<1:14> by performing an ECC encoding operation on the selection data SD<1:128> and the selection meta data SM<1:2>. The parity operation circuit 320 may be implemented to perform an ECC encoding operation by using a single error correction-double error detection or single error correction-double adjacent error correction (SEC-DED) code.

The syndrome operation circuit 330 may generate syndromes SYN<1:14>, based on the parities PRT<1:14>, the first internal parities IP1<1:8>, and the selection parities SP<1:6>. The syndrome operation circuit 330 may generate the syndromes SYN<1:14> by operating the parities PRT<1:14> generated from the parity operation circuit 320, the first internal parities IP1<1:8> generated after the start of the first read operation, and the selection parities SP<1:6> generated after the start of the second read operation.

The error correction circuit 340 may detect the location of an error that is included in the selection data SD<1:128> and the selection meta data SM<1:2>, based on the syndromes SYN<1:14>. The error correction circuit 340 may correct an error that is included in the selection data SD<1:128> and the selection meta data SM<1:2> by performing an ECC decoding operation on the syndromes SYN<1:14>. The error correction circuit 340 may output the selection data SD<1:128> having an error corrected as the transfer data TD<1:128>. The error correction circuit 340 may output the selection meta data SM<1:2> having an error corrected as the transfer meta data TMD<1:2>. The error correction circuit 340 may be implemented to perform an ECC decoding operation by using a single error correction-double error detection or single error correction-double adjacent error correction (SEC-DED) code.

The write control circuit 350 may generate the first internal data ID1<1:64> and the second internal data ID2<1:64> from the selection data SD<1:128> based on the meta enable signal M_EN and the decoding enable signals D_EN<1:16> after the start of the read modify write operation. The write control circuit 350 may generate eight bits, among the first internal data ID1<1:64> and the second internal data ID2<1:64>, from the selection meta data SM<1:2> and the write parities WP<1:6> based on the meta enable signal M_EN and the decoding enable signals D_EN<1:16> after the start of the read modify write operation.

Figure 7:
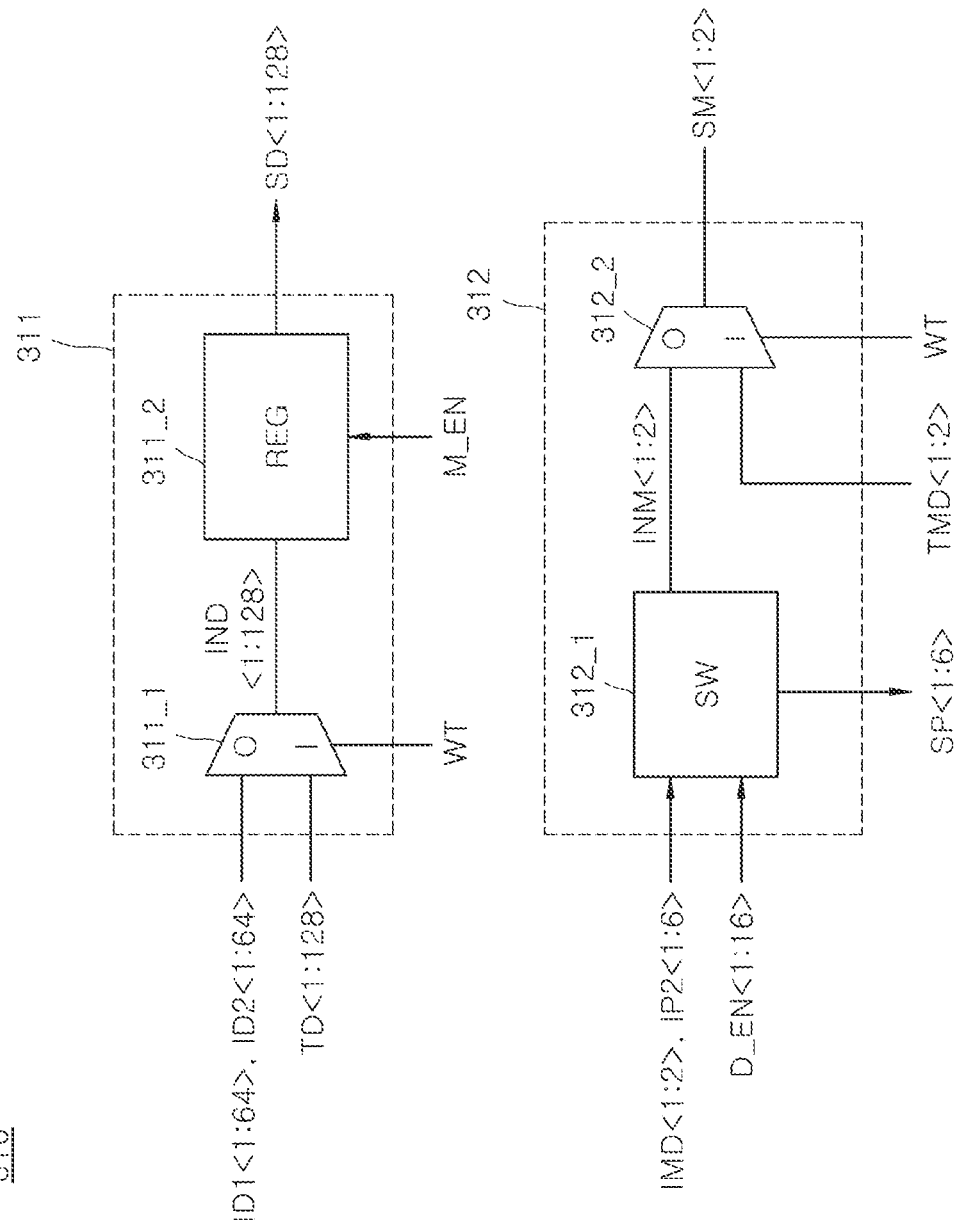
FIG. 7 is a diagram illustrating a construction according to an embodiment of a data transfer circuit that is included in the ECC circuit illustrated in FIG. 6.

FIG. 7 is a block diagram illustrating a construction according to an embodiment of the data transfer circuit 310 that is included in the ECC circuit 26. The data transfer circuit 310 may include a first data selection transfer circuit 311 and a second data selection transfer circuit 312.

The first data selection transfer circuit 311 may include a multiplexer 311_1 and a register (REG) 311_2.

The multiplexer 311_1 may generate input data IND<1:128> from the first internal data ID1<1:64> and the second internal data ID2<1:64> when the level of the write signal WT is a logic low level. The multiplexer 311_1 may generate the first to 64-th bits IND<1:64> of the input data from the first internal data ID1<1:64> when the level of the write signal WT is a logic low level. The multiplexer 311_1 may generate the 65-th to 128-th bits IND<65:128> of the input data from the second internal data ID2<1:64> when the level of the write signal WT is a logic low level. The multiplexer 311_1 may generate the input data IND<1:128> from the transfer data TD<1:128> when the level of the write signal WT is a logic high level.

The register 311_2 may store the input data IND<1:128> after the start of the first read operation. The register 3112 may store the input data IND<1:128> when the meta enable signal M_EN is disabled to a logic low level.

The second data selection transfer circuit 312 may include a switch circuit (SW) 312_1 and a multiplexer 312_2.

The switch circuit 312_1 may generate input meta data INM<1:2> and the selection parities SP<1:6> from the internal meta data IMD<1:2> and the second internal parities IP2<1:6> based on the decoding enable signals D_EN<1:16>. The switch circuit 312_1 may generate the input meta data INM<1:2> from the internal meta data IMD<1:2> when any one of the decoding enable signals D_EN<1:16> is enabled. The switch circuit 3121 may generate the selection parities SP<1:6> from the second internal parities IP2<1:6> when any one of the decoding enable signals D_EN<1:16> is enabled.

The multiplexer 312_2 may generate the selection meta data SM<1:2> from the input meta data INM<1:2> when the level of the write signal WT is a logic low level. The multiplexer 312_2 may generate the selection meta data SM<1:2> from the transfer meta data TMD<1:2> when the level of the write signal WT is a logic high level.

Figure 8:
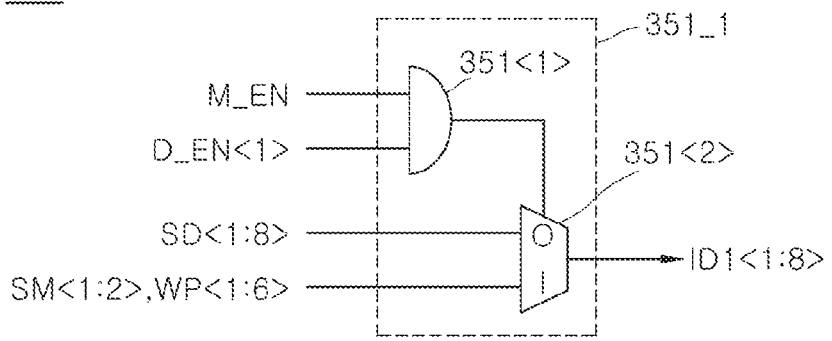
FIG. 8 is a diagram illustrating a construction according to an embodiment of a write control circuit that is included in the ECC circuit illustrated in FIG. 6.
Figure 8:
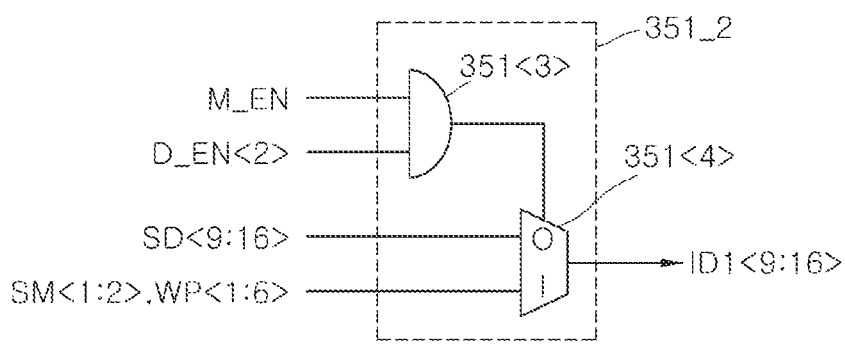
Figure 8:
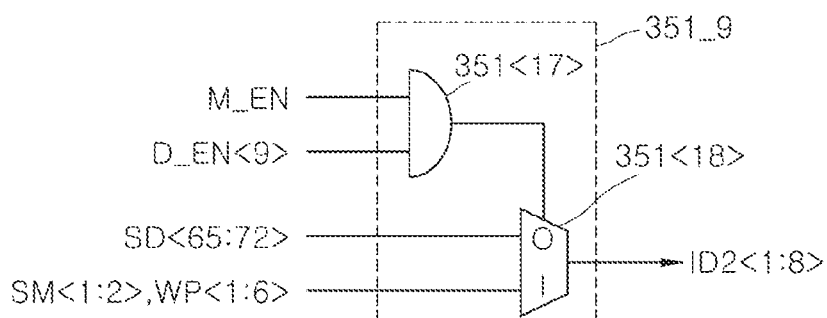
Figure 8:
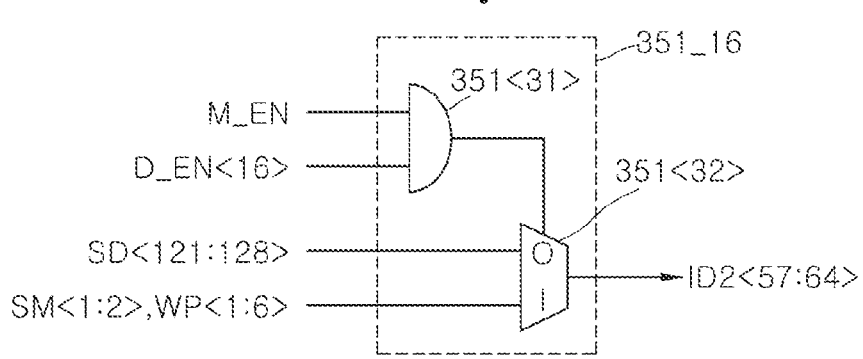

FIG. 8 is a block diagram illustrating a construction according to an embodiment of the write control circuit 350 that is included in the ECC circuit 26. The write control circuit 350 may include a first write transfer circuit 3511, a second write transfer circuit 3512, a third write transfer circuit 351_3, a fourth write transfer circuit 351_4, a fifth write transfer circuit 351_5, a sixth write transfer circuit 351_6, a seventh write transfer circuit 3517, an eighth write transfer circuit 3518, a ninth write transfer circuit 351_9, a tenth write transfer circuit 351_10, an eleventh write transfer circuit 351_11, a twelfth write transfer circuit 351_12, a thirteenth write transfer circuit 351_13, a fourteenth write transfer circuit 351_14, a fifteenth write transfer circuit 351_15, and a sixteenth write transfer circuit 351_16.

The first write transfer circuit 351_1 may include an AND gate 351<1> and a multiplexer 351<2>. The AND gate 351<1> may perform an AND operation on the meta enable signal M_EN and the first bit D_EN<1> of the decoding enable signals. The AND gate 351<1> may generate an output signal having a logic high level when both the meta enable signal M_EN and the first bit D_EN<1> of the decoding enable signals have a logic high level. The AND gate 351<1> may generate an output signal having a logic low level when the level of any one of the meta enable signal M_EN and the first bit D_EN<1> of the decoding enable signals is a logic low level. The multiplexer 351<2> may output the first to eighth bits SD<1:8> of the selection data as the first to eighth bits ID1<1:8> of the first internal data when the level of the output signal of the AND gate 351<1> is a logic low level. The multiplexer 351<2> may output the first and second bits SM<1:2> of the selection meta data as the first and second bits ID1<1:2> of the first internal data when the level of the output signal of the AND gate 351<1> is a logic high level. The multiplexer 351<2> may output the first to sixth bits WP<1:6> of the write parities as the third to eight bits ID1<3:8> of the first internal data when the level of the output signal of the AND gate 351<1> is a logic high level.

The second write transfer circuit 351_2 may include an AND gate 351<3> and a multiplexer 351<4>. The AND gate 351<3> may perform an AND operation on the meta enable signal M_EN and the second bit D_EN<2> of the decoding enable signals. The AND gate 351<3> may generate an output signal having a logic high level when both the meta enable signal M_EN and the second bit D_EN<2> of the decoding enable signals have a logic high level. The AND gate 351<3> may generate an output signal having a logic low level when the level of any one of the meta enable signal M_EN and the second bit D_EN<2> of the decoding enable signals is a logic low level. The multiplexer 351<4> may output the ninth to sixteenth bits SD<9:16> of the selection data as the ninth to sixteenth bits ID1<9:16> of the first internal data when the level of the output signal of the AND gate 351<3> is a logic low level. The multiplexer 351<4> may output the first and second bits SM<1:2> of the selection meta data as the ninth and tenth bits ID1<9:10> of the first internal data when the level of the output signal of the AND gate 351<3> is a logic high level. The multiplexer 351<4> may output the first to sixth bits WP<1:6> of the write parities as the eleventh to sixteenth bits ID1<11:16> of the first internal data when the level of the output signal of the AND gate 351<3> is a logic high level.

The third to eighth write transfer circuits 351_3 to 351_8 may be implemented to have the same construction as the first and second write transfer circuits 351_1 and 351_2 and to perform the same operation as the first and second write transfer circuits 351_1 and 351_2 except signals that are input to and output from the third to eighth write transfer circuits 351_3 to 3518, and thus a detailed description thereof may be omitted.

The ninth write transfer circuit 351_9 may include an AND gate 351<17> and a multiplexer 351<18>. The AND gate 351<17> may perform an AND operation on the meta enable signal M_EN and the ninth bit D_EN<9> of the decoding enable signals. The AND gate 351<17> may generate an output signal having a logic high level when both the meta enable signal M_EN and the ninth bit D_EN<9> of the decoding enable signals have a logic high level. The AND gate 351<17> may generate an output signal having a logic low level when the level of any one of the meta enable signal M_EN and the ninth bit D_EN<9> of the decoding enable signals is a logic low level. The multiplexer 351<18> may output the 65-th to 72-th bits SD<65:72> of the selection data as the first to eighth bits ID2<1:8> of the second internal data when the level of the output signal of the AND gate 351<17> is a logic low level. The multiplexer 351<18> may output the first and second bits SM<1:2> of the selection meta data as the first and second bits ID2<1:2> of the second internal data when the level of the output signal of the AND gate 351<17> is a logic high level. The multiplexer 351<18> may output the first to sixth bits WP<1:6> of the write parities as the third to eight bits ID2<3:8> of the second internal data when the level of the output signal of the AND gate 351<17> is a logic high level.

The tenth to fifteenth write transfer circuits 351_10 to 351_15 may be implemented to have the same construction as the ninth write transfer circuit 351_9 and to perform the same operation as the ninth write transfer circuit 351_9 except signals that are input to and output from the tenth to fifteenth write transfer circuits 351_10 to 351_15, and a detailed description thereof may be omitted.

The sixteenth write transfer circuit 351_16 may include an AND gate 351<31> and a multiplexer 351<32>. The AND gate 351<31> may perform an AND operation on the meta enable signal M_EN and the sixteenth bit D_EN<16> of the decoding enable signals. The AND gate 351<31> may generate an output signal having a logic high level when both the meta enable signal M_EN and the sixteenth bit D_EN<16> of the decoding enable signals have a logic high level. The AND gate 351<31> may generate an output signal having a logic low level when the level of any one of the meta enable signal M_EN and the sixteenth bit D_EN<16> of the decoding enable signals is a logic low level. The multiplexer 351<32> may output the 121-th to 128-th bits SD<121:128> of the selection data as the 57-th to 64-th bits ID2<57:64> of the second internal data when the level of the output signal of the AND gate 351<31> is a logic low level. The multiplexer 351<32> may output the first and second bits SM<1:2> of the selection meta data as the 57-th and 58-th bits ID2<57:58> of the second internal data when the level of the output signal of the AND gate 351<31> is a logic high level. The multiplexer 351<32> may output the first to sixth bits WP<1:6> of the write parities as the 59-th to 64-th bits ID2<59:64> of the second internal data when the level of the output signal of the AND gate 351<31> is a logic high level.

Figure 9:
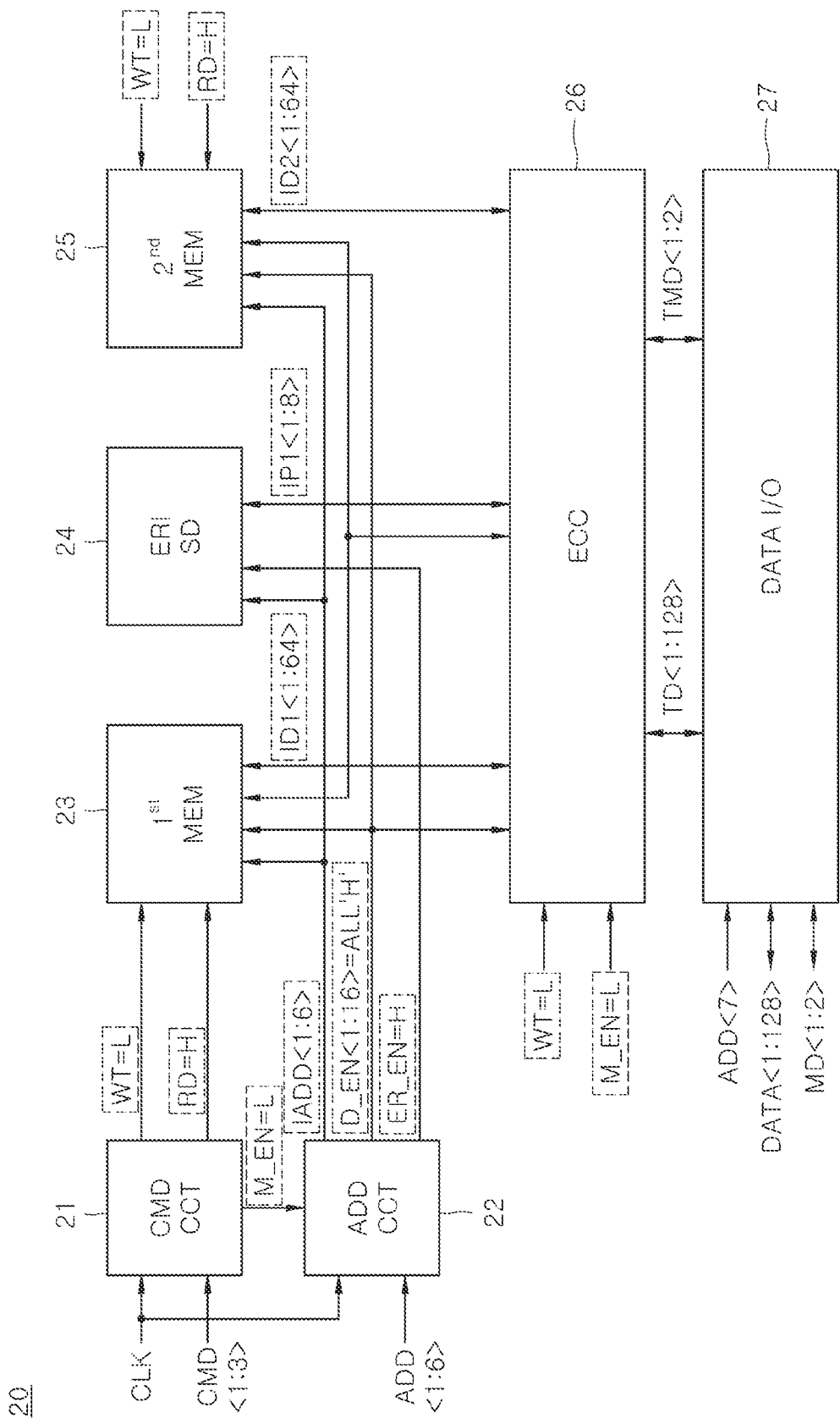
FIGS. 9, 10, 11, and 12 are diagrams for describing an operation of a semiconductor module according to an embodiment of the present disclosure.
Figure 10:
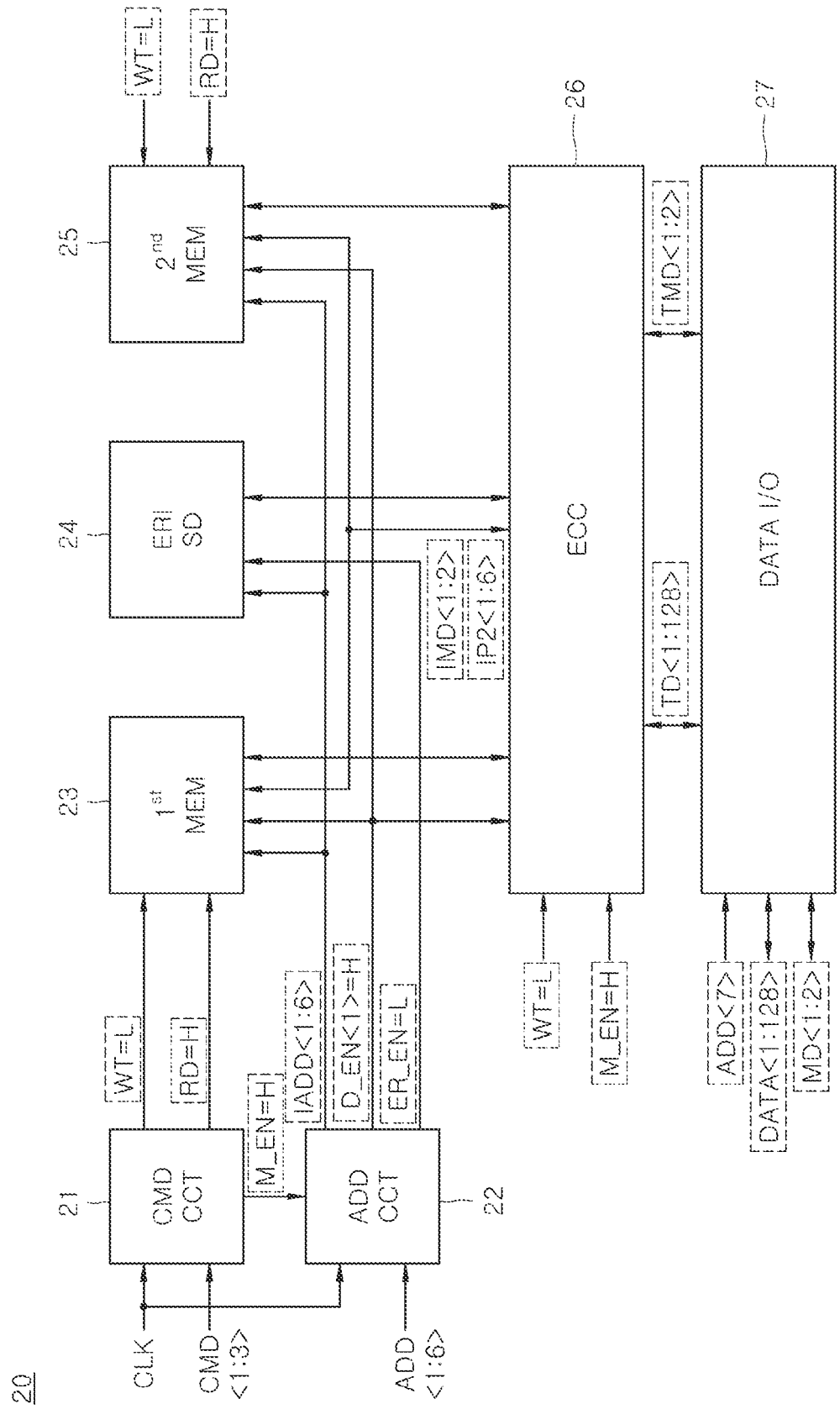

An error correction operation of the semiconductor module 20 according to an embodiment of the present disclosure is described with reference to FIGS. 9 and 10. In this case, an operation of correcting an error of data by using bits that have been stored in the first mat of the first memory circuit as a parity that is used in the ECC circuit after the start of the first and second read operations is described as follows.

First, the first read operation is described as follows with reference to FIG. 9.

The command control circuit 21 may generate the read signal RD that is enabled to a logic high level and the write signal WT that is disabled to a logic low level (i.e., L), when the commands CMD<1:3> that are input in synchronization with the clock CLK have a logic level combination for performing the first read operation. The command control circuit 21 may generate the meta enable signal M_EN that is disabled to a logic low level, when the commands CMD<1:3> that are input in synchronization with the clock CLK have a logic level combination for performing the first read operation.

The address control circuit 22 may generate the internal addresses IADD<1:6> based on the addresses ADD<1:6> in synchronization with the clock CLK after the start of the first read operation. The address control circuit 22 may generate the decoding enable signals D_EN<1:16> all of which are enabled to a logic high level (i.e., H), when the meta enable signal M_EN is disabled to a logic low level, after the start of the first read operation. The address control circuit 22 may generate the error information enable signal ER_EN that is enabled to a logic high level when the meta enable signal M_EN is disabled to a logic low level, after the start of the first read operation.

The first memory circuit 23 may output the first internal data ID1<1:64> based on the first to sixth internal addresses IADD<1:6> and the first to eighth bits D_EN<1:8> of the decoding enable signals all of which are enabled, when the read signal RD is enabled, after the start of the first read operation.

The error information storage circuit 24 may output the first internal parities IP1<1:8> that have been stored in the error information storage circuit 24, when the error information enable signal ER_EN is enabled, after the start of the first read operation.

The second memory circuit 25 may output the second internal data ID2<1:64> based on the internal addresses IADD<1:6> and the ninth to sixteenth bits D_EN<9:16> of the decoding enable signals all of which are enabled, when the read signal RD is enabled, after the start of the first read operation.

The data transfer circuit 310 of the ECC circuit 26 may receive the first internal data ID1<1:64>, the second internal data ID2<1:64>, and the first internal parities IP1<1:8> when the level of the write signal WT is a logic low level after the start of the first read operation.

Next, the second read operation is described as follows with reference to FIG. 10.

The command control circuit 21 may generate the read signal RD that is enabled to a logic high level and the write signal WT that is disabled to a logic low level, when the commands CMD<1:3> that are input in synchronization with the clock CLK have a logic level combination for performing the second read operation. The command control circuit 21 may generate the meta enable signal M_EN that is enabled to a logic high level, when the commands CMD<1:3> that are input in synchronization with the clock CLK have a logic level combination for performing the second read operation.

The address control circuit 22 may generate the internal addresses IADD<1:6> based on the addresses ADD<1:6> in synchronization with the clock CLK after the start of the second read operation. The address control circuit 22 may generate the first bit D_EN<1> having a logic high level, among the decoding enable signals, when the meta enable signal M_EN is enabled to a logic high level after the start of the second read operation. The address control circuit 22 may generate the error information enable signal ER_EN that is disabled to a logic low level when the meta enable signal M_EN is enabled to a logic high level after the start of the second read operation.

The first mat 231 of the first memory circuit 23 may output the internal meta data IMD<1:2> and the second internal parities IP2<1:6>, based on the first to sixth internal addresses IADD<1:6> and the first bit D_EN<1> of the decoding enable signals that are enabled to a logic high level, when the read signal RD is enabled after the start of the second read operation.

The data transfer circuit 310 of the ECC circuit 26 may generate the selection data SD<1:128> from the first internal data ID1<1:64> and the second internal data ID2<1:64> that have been received in the first read operation, when the level of the meta enable signal M_EN is a logic high level after the start of the second read operation. The data transfer circuit 310 may generate the selection meta data SM<1:2> from the internal meta data IMD<1:2> and generate the selection parities SP<1:6> from the second internal parities IP2<1:6>, when the level of the write signal WT is a logic low level and the level of the first bit D_EN<1>, among the decoding enable signals, is a logic high level, after the start of the second read operation.

The parity operation circuit 320 of the ECC circuit 26 may generate the parities PRT<1:14> by performing an ECC encoding operation on the selection data SD<1:128> and the selection meta data SM<1:2>.

The syndrome operation circuit 330 of the ECC circuit 26 may generate the syndromes SYN<1:14> by operating the parities PRT<1:14> generated by the parity operation circuit 320, the first internal parities IP1<1:8> generated after the start of the first read operation, and the selection parities SP<1:6> generated after the start of the second read operation.

The error correction circuit 340 of the ECC circuit 26 may correct an error that is included in the selection data SD<1:128> and the selection meta data SM<1:2> by performing an ECC decoding operation on the syndromes SYN<1:14>. The error correction circuit 340 may output the selection data SD<1:128> having an error corrected as the transfer data TD<1:128>, and may output the selection meta data SM<1:2> having an error corrected as the transfer meta data TMD<1:2>.

The data input and output circuit 27 may output the transfer data TD<1:128> as the data DATA<1:128> and output the transfer meta data TMD<1:2> as the meta data MD<1:2> after the start of a read operation.

As described above, the semiconductor module 20 can perform an error correction operation on data by using some bits that are stored in the memory circuit in which meta data has been stored as a parity that is used in the ECC circuit 26 after the start of the second read operation, after outputting the first internal data ID1<1:64> and the second internal data ID2<1:64> after the start of the first read operation. In an embodiment, the semiconductor module 20 can improve the error correction ability of the ECC circuit by using some bits that are stored in the memory circuit in which meta data has been stored as a parity that is used in the ECC circuit 26 after the start of the second read operation, after outputting the first internal data ID1<1:64> and the second internal data ID2<1:64> after the start of the first read operation.

Figure 11:
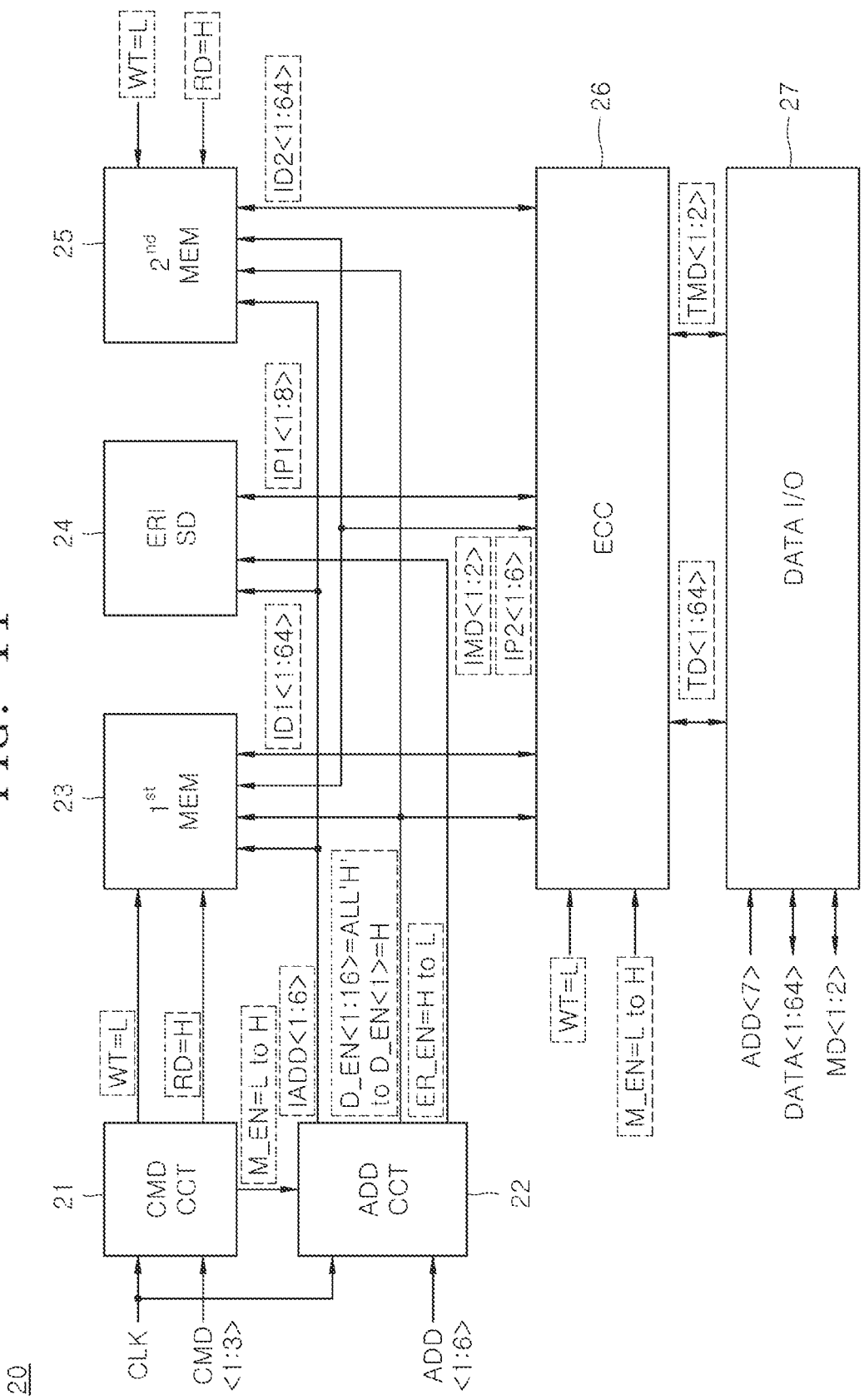
Figure 12:
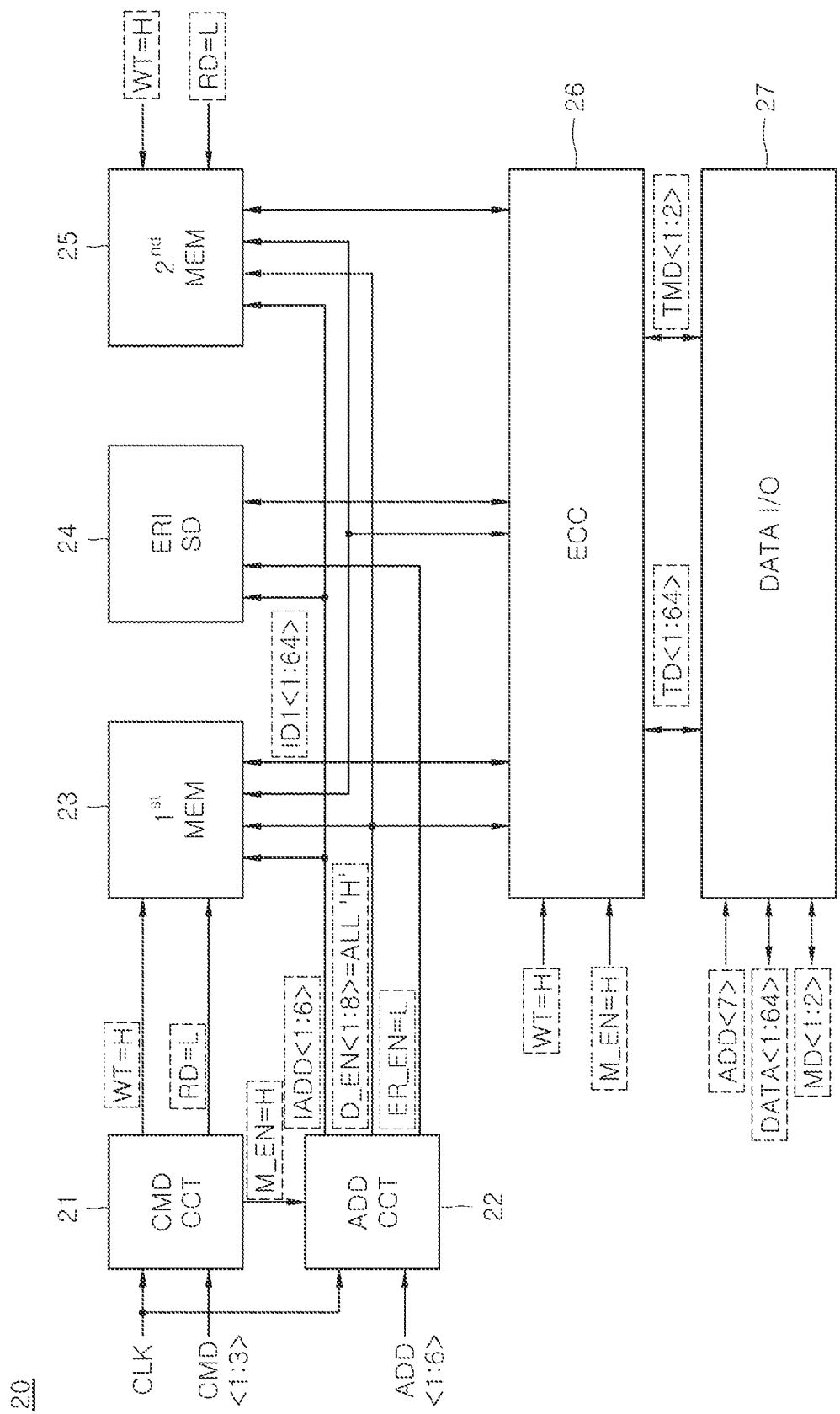

An error correction operation of the semiconductor module 20 according to an embodiment of the present disclosure is described with reference to FIGS. 11 and 12. In this case, an operation of correcting an error of data by using bits stored in the first mat of the first memory circuit as a parity that is used in the ECC circuit after the start of the read modify write operation is described as follows.

First, first and second read operations of the read modify write operation are described as follows with reference to FIG. 11.

The command control circuit 21 may generate the read signal RD that is enabled to a logic high level and the write signal WT that is disabled to a logic low level, when the commands CMD<1:3> that are input in synchronization with the clock CLK have a logic level combination for performing the read modify write operation. The command control circuit 21 may generate the meta enable signal M_EN that is disabled to a logic low level, when the commands CMD<1:3> that are input in synchronization with the clock CLK have a logic level combination for performing the read modify write operation.

The address control circuit 22 may generate the internal addresses IADD<1:6> based on the addresses ADD<1:6> in synchronization with the clock CLK after the start of the first read operation of the read modify write operation. The address control circuit 22 may generate the decoding enable signals D_EN<1:16> all of which are enabled to a logic high level, when the meta enable signal M_EN is disabled to a logic low level, after the start of the first read operation of the read modify write operation. The address control circuit 22 may generate the error information enable signal ER_EN that is enabled to a logic high level when the meta enable signal M_EN is disabled to a logic low level after the start of the first read operation of the read modify write operation.

The first memory circuit 23 may output the first internal data ID1<1:64>, based on the first to sixth internal addresses IADD<1:6> and the first to eighth bits D_EN<1:8> of the decoding enable signals all of which are enabled, when the read signal RD is enabled after the start of the first read operation of the read modify write operation.

The error information storage circuit 24 may output the first internal parities IP1<1:8> that have been stored in the error information storage circuit 24, when the error information enable signal ER_EN is enabled after the start of the first read operation of the read modify write operation.

The second memory circuit 25 may output the second internal data ID2<1:64> based on the internal addresses IADD<1:6> and the ninth to sixteenth bits D_EN<9:16> of the decoding enable signals all of which are enabled, when the read signal RD is enabled after the start of the first read operation of the read modify write operation.

The data transfer circuit 310 of the ECC circuit 26 may receive the first internal data ID1<1:64>, the second internal data ID2<1:64>, and the first internal parities IP1<1:8> when the level of the write signal WT is a logic low level after the start of the first read operation of the read modify write operation.

The command control circuit 21 may generate the read signal RD that is enabled to a logic high level and the write signal WT that is disabled to a logic low level, when the commands CMD<1:3> that are input in synchronization with the clock CLK have a logic level combination for performing the read modify write operation. The command control circuit 21 may generate the meta enable signal M_EN that is enabled to a logic high level when the commands CMD<1:3> that are input in synchronization with the clock CLK have a logic level combination for performing the read modify write operation.

The address control circuit 22 may generate the internal addresses IADD<1:6> based on the addresses ADD<1:6> in synchronization with the clock CLK after the start of the second read operation of the read modify write operation. The address control circuit 22 may generate the first bit D_EN<1> having a logic high level, among the decoding enable signals, when the meta enable signal M_EN is enabled to a logic high level after the start of the second read operation of the read modify write operation. The address control circuit 22 may generate the error information enable signal ER_EN that is disabled to a logic low level when the meta enable signal M_EN is enabled to a logic high level after the start of the second read operation of the read modify write operation.

The first mat 231 of the first memory circuit 23 may output the internal meta data IMD<1:2> and the second internal parities IP2<1:6>, based on the first to sixth internal addresses IADD<1:6> and the first bit D_EN<1> of the decoding enable signals that are enabled to a logic high level, when the read signal RD is enabled after the start of the second read operation of the read modify write operation.

The data transfer circuit 310 of the ECC circuit 26 may generate the selection data SD<1:128> from the first internal data ID1<1:64> and the second internal data ID2<1:64> that have been received in the first read operation, when the level of the meta enable signal M_EN is a logic high level after the start of the second read operation of the read modify write operation. The data transfer circuit 310 may generate the selection meta data SM<1:2> from the internal meta data IMD<1:2> and generate the selection parities SP<1:6> from the second internal parities IP2<1:6>, when the level of the write signal WT is a logic low level and the level of the first bit D_EN<1> of the decoding enable signals is a logic high level after the start of the second read operation of the read modify write operation.

The parity operation circuit 320 of the ECC circuit 26 may generate the parities PRT<1:14> by performing an ECC encoding operation on the selection data SD<1:128> and the selection meta data SM<1:2>.

The syndrome operation circuit 330 of the ECC circuit 26 may generate the syndromes SYN<1:14> by operating the parities PRT<1:14> generated from the parity operation circuit 320, the first internal parities IP1<1:8> generated after the start of the first read operation, and the selection parities SP<1:6> after the start of the second read operation.

The error correction circuit 340 of the ECC circuit 26 may correct an error that is included in the selection data SD<1:128> and the selection meta data SM<1:2> by performing an ECC decoding operation on the syndromes SYN<1:14>. The error correction circuit 340 may output the selection data SD<1:128> having an error corrected as the transfer data TD<1:128>, and may output the selection meta data SM<1:2> having an error corrected as the transfer meta data TMD<1:2>.

A write operation of the read modify write operation is described as follows with reference to FIG. 12.

The command control circuit 21 may generate the read signal RD that is disabled to a logic low level and the write signal WT that is enabled to a logic high level, when the commands CMD<1:3> that are input in synchronization with the clock CLK have a logic level combination for performing the read modify write operation. The command control circuit 21 may generate the meta enable signal M_EN that is enabled to a logic high level, when the commands CMD<1:3> that are input in synchronization with the clock CLK have a logic level combination for performing the read modify write operation.

The address control circuit 22 may generate the internal addresses IADD<1:6> based on the addresses ADD<1:6> in synchronization with the clock CLK after the start of a write operation of the read modify write operation. The address control circuit 22 may generate the first to eighth bits D_EN<1:8> having a logic high level, among the decoding enable signals, after the start of the write operation of the read modify write operation. The address control circuit 22 may generate the error information enable signal ER_EN that is disabled to a logic low level after the start of the write operation of the read modify write operation.

The data input and output circuit 27 may output the data DATA<1:64> as the first to 64-th bits TD<1:64> of the transfer data and output the meta data MD<1:2> as the transfer meta data TMD<1:2>, based on the seventh bit ADD<7> of the addresses after the start of the write operation of the read modify write operation.

The data transfer circuit 310 of the ECC circuit 26 may receive the transfer data TD<1:64> when the level of the write signal WT is a logic high level after the start of the write operation of the read modify write operation. The data transfer circuit 310 may generate the selection data SD<1:64> from the transfer data TD<1:64> that are received when the level of the meta enable signal M_EN is a logic high level after the start of the write operation of the read modify write operation. The data transfer circuit 310 may generate the selection meta data SM<1:2> from the transfer meta data TMD<1:2> when the first to eighth bits D_EN<1:8> of the decoding enable signals have a logic high level after the start of the write operation of the read modify write operation.

The parity operation circuit 320 may generate the write parities WP<1:6> by performing an ECC encoding operation on the selection meta data SM<1:2> and the selection parities SP<1:6>.

The write control circuit 350 may generate the first internal data ID1<1:64> from the selection data SD<1:64> when the level of the meta enable signal M_EN is a logic high level after the start of the write operation of the read modify write operation.

The first to eighth mats 231 to 238 of the first memory circuit 23 may store the first internal data ID1<1:64> based on the first to sixth internal addresses IADD<1:6> when the level of the write signal WT is enabled to a logic high level after the start of the read modify write operation.

The address control circuit 22 may generate the internal addresses IADD<1:6> based on the addresses ADD<1:6> in synchronization with the clock CLK after the start of the write operation of the read modify write operation. The address control circuit 22 may generate the first bit D_EN<1> having a logic high level, among the decoding enable signals, after the start of the write operation of the read modify write operation. The address control circuit 22 may generate the error information enable signal ER_EN that is disabled to a logic low level after the start of the write operation of the read modify write operation.

The write control circuit 350 may generate the first to eighth bits ID1<1:8> of the first internal data from the selection meta data SM<1:2> and the selection write parities WP<1:6> when the level of the meta enable signal M_EN is a logic high level and the level of the first bit D_EN<1> of the decoding enable signals is a logic high level after the start of the write operation of the read modify write operation.

The first mat 231 of the first memory circuit 23 may store the first to eighth bits ID1<1:8> of the first internal data based on the first to sixth internal addresses IADD<1:6> when the level of the write signal WT is a logic high level and the level of the first bit D_EN<1> of the decoding enable signals is a logic high level after the start of the write operation of the read modify write operation.

As described above, in an embodiment, the semiconductor module 20 can improve the error correction ability of the ECC circuit by using some bits stored in a memory circuit in which meta data has been stored as a parity that is used in the ECC circuit 26 after the start of the first and second read operations of the read modify write operation and storing data and the parity after the start of the write operation of the read modify write operation.

Figure 13:
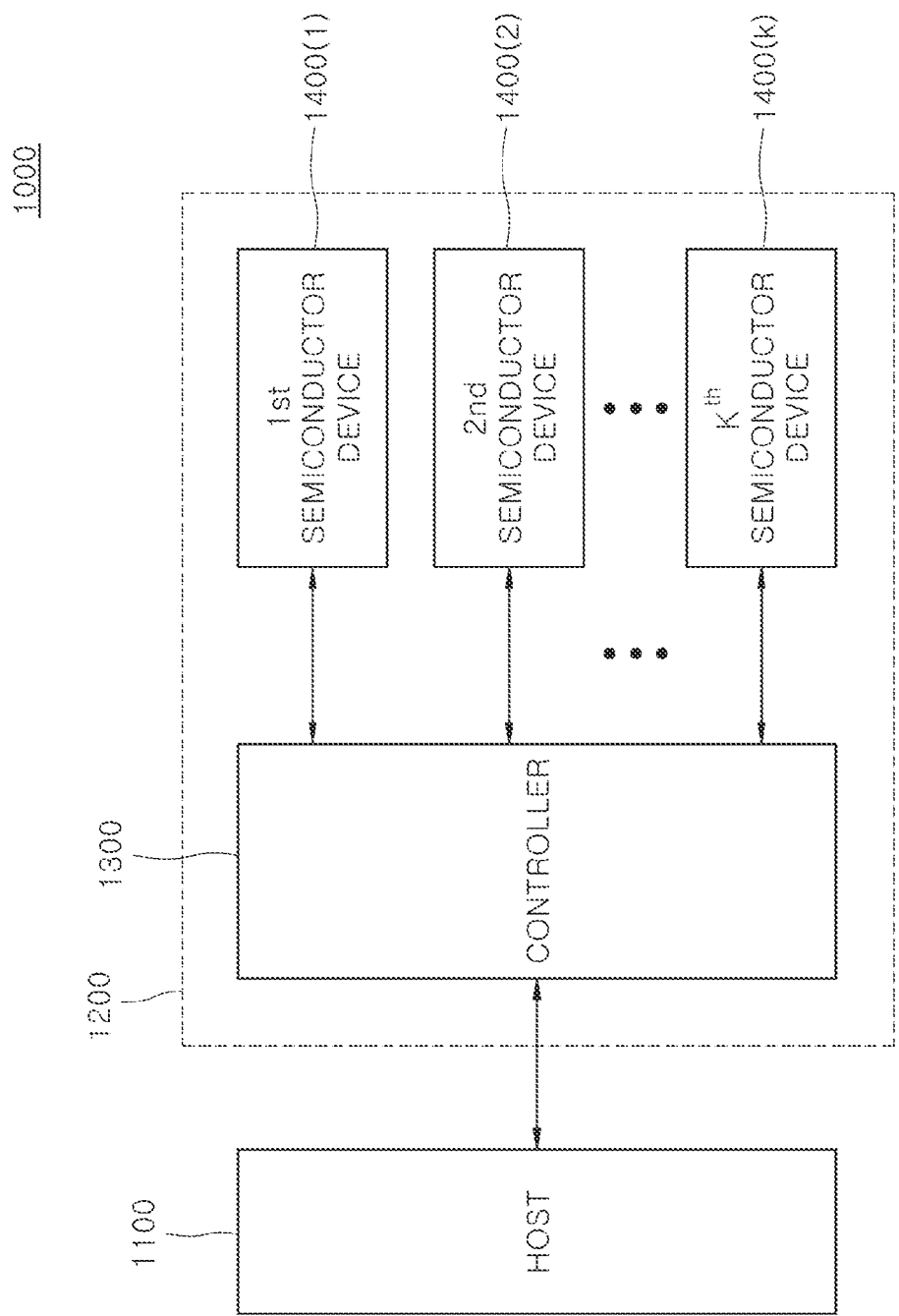
FIG. 13 is a diagram illustrating a construction according to an embodiment of an electronic system to which the semiconductor system illustrated in FIGS. 1 and 12 has been applied.

FIG. 13 is a block diagram illustrating a construction according to an embodiment of an electronic system 1000 according to an embodiment of the present disclosure. As illustrated in FIG. 13, the electronic system 1000 may include a host 1100 and a semiconductor system 1200.

The host 1100 and the semiconductor system 1200 may mutually transmit signals by using an interface protocol. The interface protocol that is used between the host 1100 and the semiconductor system 1200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), a universal serial bus (USB).

The semiconductor system 1200 may include a controller 1300 and semiconductor devices 1400(1:K). The controller 1300 may control the semiconductor devices 1400(K:1) so that the semiconductor devices 1400(K:1) perform a read operation and a read modify write operation. Each of the semiconductor devices 1400(K:1) can perform an error correction operation on data by using some bits stored in a memory circuit in which meta data has been stored as a parity that is used in the ECC circuit after the start of the second read operation, after outputting internal data after the start of the first read operation. In an embodiment, each of the semiconductor devices 1400(K:1) can improve the error correction ability of the ECC circuit by using some bits stored in a memory circuit in which meta data has been stored as a parity that is used in the ECC circuit after the start of the second read operation, after outputting internal data after the start of the first read operation.

The controller 1300 may be implemented as the controller 10 illustrated in FIG. 1. Each of the semiconductor devices 1400(K:1) may be implemented as the semiconductor module 20 illustrated in FIG. 1. According to an embodiment of the present disclosure, each of the semiconductor devices 1400(K:1) may be implemented as one of dynamic random access memory (DRAM), phase change random access memory (PRAM), resistive random access memory (RRAM), magnetic random access memory (MRAM), and ferroelectric random access memory (FRAM).

What is claimed is:

1. A semiconductor module comprising:
    an address control circuit configured to generate an internal address based on an address in a first read operation and a second read operation that are sequentially performed and configured to generate multiple decoding enable signals and an error information enable signal;
    a memory circuit comprising multiple mats and configured to output internal data based on the internal address and the multiple decoding enable signals in the first read operation and configured to output internal meta data and second internal parities based on the internal address and the multiple decoding enable signals in the second read operation; and
    an error information storage circuit configured to output first internal parities based on the internal address and the error information enable signal in the first read operation.

2. The semiconductor module of claim 1, wherein:
    after a start of the first read operation, the address is input as a logic level combination for outputting the internal data; and
    after a start of the second read operation, the address is input as a logic level combination for outputting the internal meta data and the second internal parities.

3. The semiconductor module of claim 1, wherein the address control circuit is configured to:
    enable both the multiple decoding enable signals and the error information enable signal after a start of the first read operation; and
    enable any one of the multiple decoding enable signals after a start of the second read operation.

4. The semiconductor module of claim 1, wherein the address control circuit comprises:
    an address transfer circuit configured to generate the internal address from the address when a meta enable signal is disabled after a start of the first read operation and configured to generate the internal address from the meta address when the meta enable signal is enabled after a start of the second read operation; and
    a column control circuit configured to enable both the multiple decoding enable signals and the error information enable signal when the meta enable signal is disabled and configured to generate the meta address from the address when the meta enable signal is enabled.

5. The semiconductor module of claim 1,
    wherein a number of bits that are included in the internal data is set as a number of bits that is at least 2N times or more a number of bits that are included in the internal meta data and the second internal parities, and
    wherein N is an integer greater than zero.

6. The semiconductor module of claim 1, wherein:
    in the first read operation, all of the multiple mats are enabled to output the internal data based on the internal address and the multiple decoding enable signals; and
    in the second read operation, any one of the multiple mats is enabled to output the internal meta data and the second internal parities based on the internal address and the multiple decoding enable signals.

7. The semiconductor module of claim 1, further comprising an error correction code (ECC) circuit configured to receive the internal data and the first internal parities after a start of the first read operation, configured to receive the internal meta data and the second internal parities after a start of the second read operation, and configured to output the internal data and the internal meta data as transfer data and transfer meta data by correcting an error that is included in the internal data and the internal meta data based on the first internal parities and the second internal parities.

8. The semiconductor module of claim 7, wherein the ECC circuit comprises:
    a data transfer circuit configured to generate selection data from the internal data based on a meta enable signal and the multiple decoding enable signals after the start of the first read operation and configured to generate selection meta data and selection parities from the internal meta data and the second internal parities after the start of the second read operation;

a syndrome operation circuit configured to generate a syndrome based on the first internal parities and the selection parities; and an error correction circuit configured to output the selection data as the transfer data by correcting an error that is included in the selection data by performing an ECC decoding operation on the selection data based on the syndrome and configured to output the selection meta data as the transfer meta data by correcting an error that is included in the selection meta data by performing an ECC decoding operation on the selection meta data based on the syndrome.

9. The semiconductor module of claim 8, wherein the data transfer circuit comprises:
a first data selection transfer circuit configured to receive the internal data, configured to store the internal data when the meta enable signal is disabled, and configured to generate the selection data from the stored internal data; and
a second data selection transfer circuit configured to generate the selection meta data and the selection parities from the internal meta data and the second internal parities based on the multiple decoding enable signals.

10. A semiconductor module comprising:
a first memory circuit configured to output first internal data that has been stored in the first memory circuit after a start of a first read operation;
a second memory circuit configured to output second internal data that has been stored in the second memory circuit after the start of the first read operation;
an error information storage circuit configured to output first internal parities that has been stored in the error information storage circuit after the start of the first read operation; and
an error correction code (ECC) circuit configured to receive the first internal data, the second internal data, and the first internal parities after the start of the first read operation, configured to receive internal meta data and second internal parities that are output by any one of the first memory circuit or the second memory circuit after a start of a second read operation, and configured to correct and output an error that is included in the first internal data, the second internal data, and the internal meta data, based on the first internal parities and the second internal parities.

11. The semiconductor module of claim 10, wherein:
the first memory circuit comprises a first group of mats;
the second memory circuit comprises a second group of mats;
after the start of the first read operation, all of the mats of the first group are enabled to output the first internal data, and all of the mats of the second group are enabled to output the second internal data; and
after the start of the second read operation, any one of the mats of the first group and the mats of the second group is enabled to output the internal meta data and the second internal parities.

12. The semiconductor module of claim 10, wherein a number of bits that are included in the first internal data and the second internal data is set as a number of bits that are at least 2N times or more a number of bits that are included in the meta data and the second internal parities, and
wherein N is an integer greater than zero.

13. The semiconductor module of claim 10, wherein the ECC circuit comprises:

a data transfer circuit configured to generate selection data from the first internal data and the second internal data based on a meta enable signal and multiple decoding enable signals after the start of the first read operation and configured to generate selection meta data and selection parities from the internal meta data and the second internal parities after the start of the second read operation;
a syndrome operation circuit configured to generate syndromes based on the first internal parities and the selection parities; and
an error correction circuit (ECC) configured to output the selection data as transfer data by correcting an error that is included in the selection data by performing an ECC decoding operation on the selection data based on the syndromes and configured to output the selection meta data as transfer meta data by correcting an error that is included in the selection meta data by performing an ECC decoding operation on the selection meta data based on the syndromes.

14. The semiconductor module of claim 13, wherein the data transfer circuit comprises:
a first data selection transfer circuit configured to receive the first internal data and the second internal data, configured to store the first internal data and the second internal data when the meta enable signal is disabled, and configured to generate the selection data by serializing the stored first internal data and the stored second internal data; and
a second data selection transfer circuit configured to generate the selection meta data and the selection parities from the internal meta data and the second internal parities based on the multiple decoding enable signals.

15. A semiconductor module comprising:
a memory circuit comprising multiple mats, configured to output internal data based on an internal address and multiple decoding enable signals in a first read operation of a read modify write operation, configured to output internal meta data and a second internal parities based on the internal address and the multiple decoding enable signals in a second read operation of the read modify write operation, and configured to store the internal data having an error corrected, the internal meta data having an error corrected, and the second internal parities after a start of a write operation of the read modify write operation;
an error information storage circuit configured to output first internal parities based on the internal address and an error information enable signal in the first read operation of the read modify write operation; and
an error correction code (ECC) circuit configured to receive the internal data and the first internal parities after a start of the first read operation of the read modify write operation, configured to receive the internal meta data and the second internal parities after a start of the second read operation of the read modify write operation, configured to generate the internal data from transfer data after a start of the read modify write operation, and configured to output the internal data and the internal meta data to the memory circuit by correcting an error that is included in the internal data and the internal meta data based on the first internal parities and the second internal parities.

16. The semiconductor module of claim 15, wherein:
after the start of the first read operation of the read modify write operation, the internal address is input as a logic level combination for outputting the internal data, and
after the start of the second read operation of the read modify write operation, the internal address is input as a logic level combination for outputting the internal meta data and the second internal parities.

17. The semiconductor module of claim 15, wherein:
in the first read operation of the read modify write operation, all of the multiple mats are enabled to output the internal data based on the internal address and the multiple decoding enable signals, and
in the second read operation of the read modify write operation, any one of the multiple mats is enabled to output the internal meta data and the second internal parities based on the internal address and the multiple decoding enable signals.

18. The semiconductor module of claim 15, wherein:
in the write operation of the read modify write operation, all of the multiple mats are enabled to store the internal data based on the internal address and the multiple decoding enable signals, and
in the write operation of the read modify write operation, any one of the multiple mats is enabled to store the internal meta data and the second internal parities based on the internal address and the multiple decoding enable signals.

19. The semiconductor module of claim 15, wherein the ECC circuit comprises:
a data transfer circuit configured to generate selection data from the internal data based on a meta enable signal and the multiple decoding enable signals after the start of the first read operation of the read modify write operation, configured to generate selection meta data and selection parities from the internal meta data and the second internal parities after the start of the second read operation of the read modify write operation, configured to generate the selection data from the transfer data based on the meta enable signal and a write signal the after the start of the write operation of the read modify write operation, and configured to generate the selection meta data from transfer meta data based on the write signal after the start of the write operation of the read modify write operation;
a parity operation circuit configured to generate a parity and a write parity by performing an error correction code (ECC) encoding operation on the selection data and the selection meta data;
a syndrome operation circuit configured to generate syndromes, based on the first internal parities, the selection parities, and the parity;
an error correction circuit configured to output the selection data as the transfer data by correcting an error that is included in the selection data by performing an ECC decoding operation on the selection data based on the syndromes and configured to output the selection meta data as the transfer meta data by correcting an error that is included in the selection meta data by performing an ECC decoding operation on the selection meta data based on the syndromes; and
a write control circuit configured to generate the internal data from the selection data, the selection meta data, and the write parity, based on the meta enable signal and the multiple decoding enable signals.

20. The semiconductor module of claim 19, wherein the data transfer circuit comprises:
a first data selection transfer circuit configured to generate input data from any one of the internal data and the transfer data based on the write signal, configured to store the input data when the meta enable signal is disabled, and configured to generate the selection data from the stored input data; and
a second data selection transfer circuit configured to generate input meta data and the selection parities from the internal meta data and the second internal parities based on the multiple decoding enable signals and configured to generate the selection meta data from any one of the input data or the transfer meta data based on the write signal.

* * * * *